(12) United States Patent
Noda

(10) Patent No.: US 7,727,869 B2
(45) Date of Patent: Jun. 1, 2010

(54) METHOD OF FORMING METAL WIRING AND METHOD OF MANUFACTURING ACTIVE MATRIX SUBSTRATE

(75) Inventor: Yoichi Noda, Fujimi (JP)

(73) Assignee: Seiko Epson Corporation (JP)

( * ) Notice: Subject to any disclaimer, the term of this patent is extended or adjusted under 35 U.S.C. 154(b) by 582 days.

(21) Appl. No.: 11/717,857

(22) Filed: Mar. 14, 2007

(65) Prior Publication Data

US 2007/0218594 A1 Sep. 20, 2007

(30) Foreign Application Priority Data

Mar. 17, 2006 (JP) ............... 2006-074195
Nov. 27, 2006 (JP) ............... 2006-318701

(51) Int. Cl.
*H01L 21/20* (2006.01)
*H01L 21/44* (2006.01)

(52) U.S. Cl. .................. 438/584; 438/587; 438/674; 438/654; 257/E21.586

(58) Field of Classification Search .................. 438/22, 438/30, 158, 584, 674, 587, 654, 652; 257/E21.586
See application file for complete search history.

(56) References Cited

U.S. PATENT DOCUMENTS

| 5,930,607 | A | 7/1999 | Satou | |
| 6,624,071 | B2 * | 9/2003 | Seki | 438/681 |
| 6,810,814 | B2 * | 11/2004 | Hasei | 101/485 |
| 2005/0276912 | A1 * | 12/2005 | Yamamoto et al. | 427/117 |

FOREIGN PATENT DOCUMENTS

| JP | 11-274671 | 10/1999 |
| JP | 2000-216330 | 8/2000 |
| JP | 3261699 | 12/2001 |
| JP | 2003-317610 | 11/2003 |

* cited by examiner

*Primary Examiner*—Michael Trinh
(74) *Attorney, Agent, or Firm*—Harness, Dickey & Pierce, P.L.C.

(57) ABSTRACT

A method of forming a metal wiring includes: forming a foundation layer on a substrate; applying a solution including fine metal particles and a dispersion stabilizer on the foundation layer; and heating the applied solution to form into a conductive layer, wherein after the applying of the solution, the conductive layer is formed by starting the heating of the applied solution within a detained time.

8 Claims, 16 Drawing Sheets

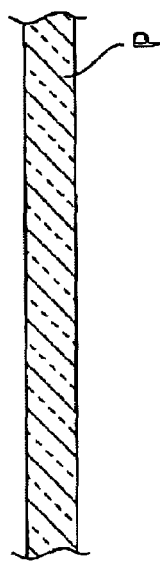
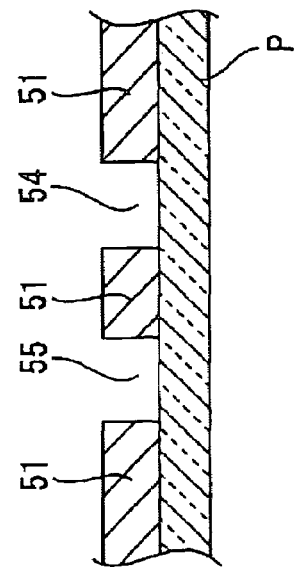
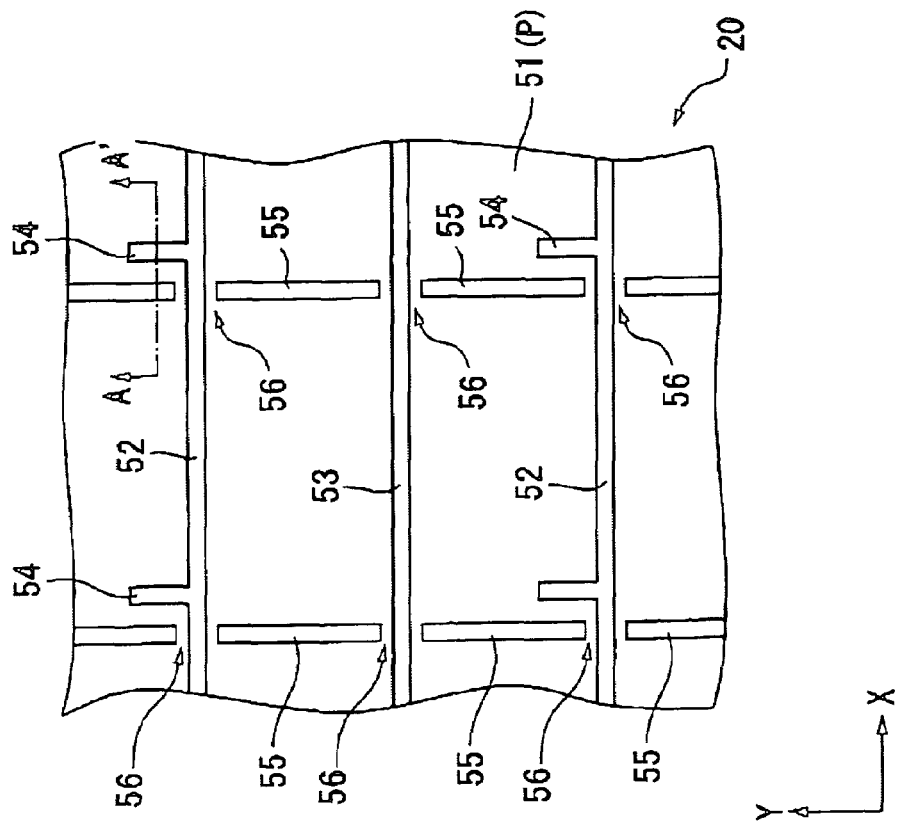

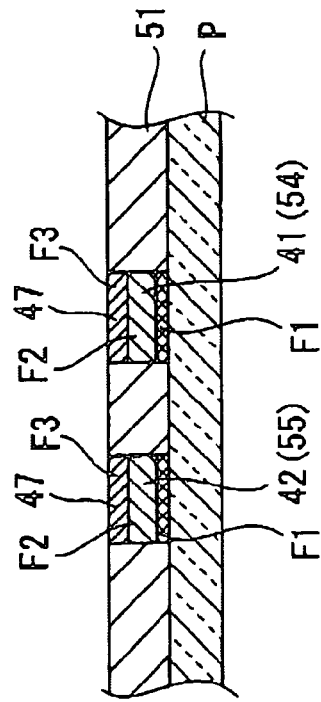
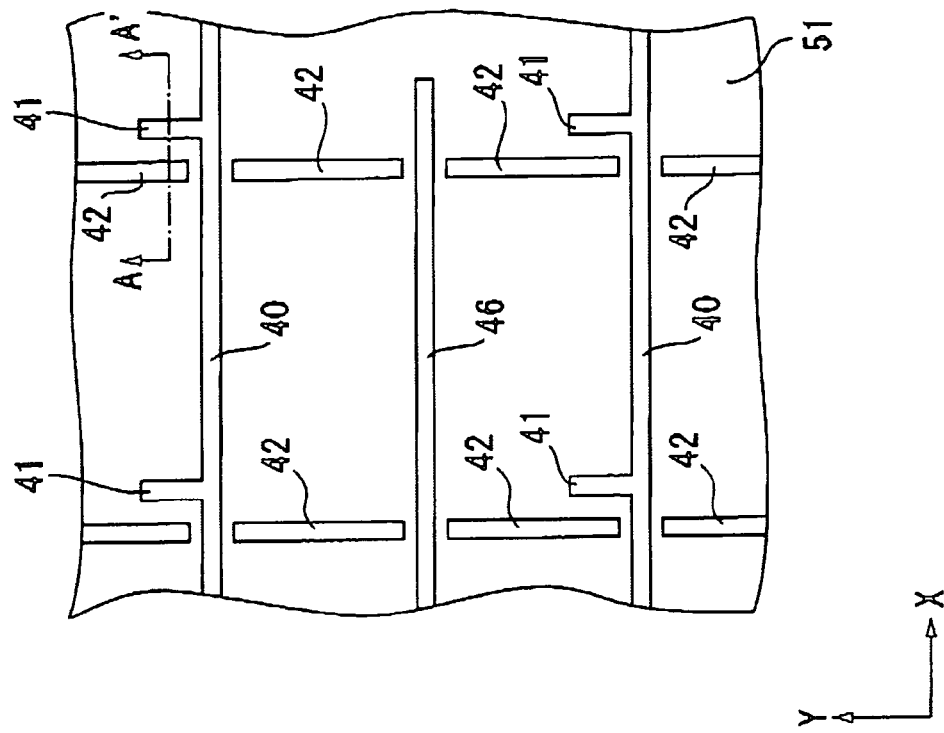

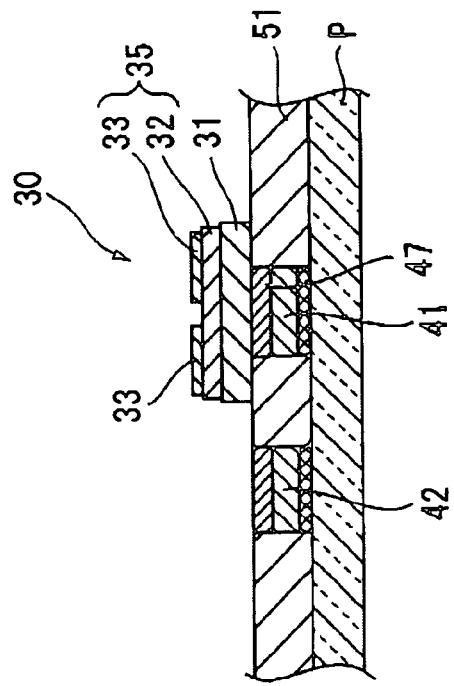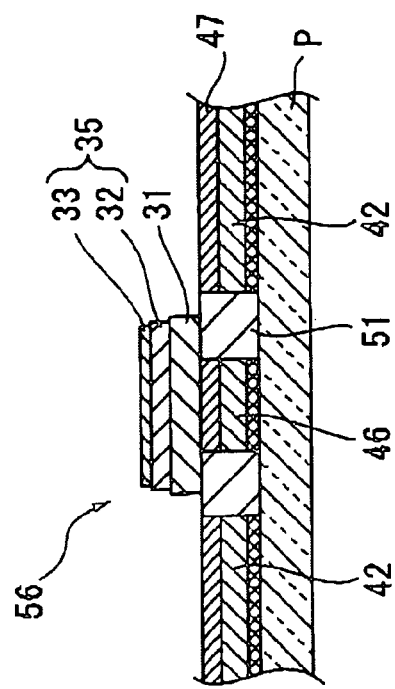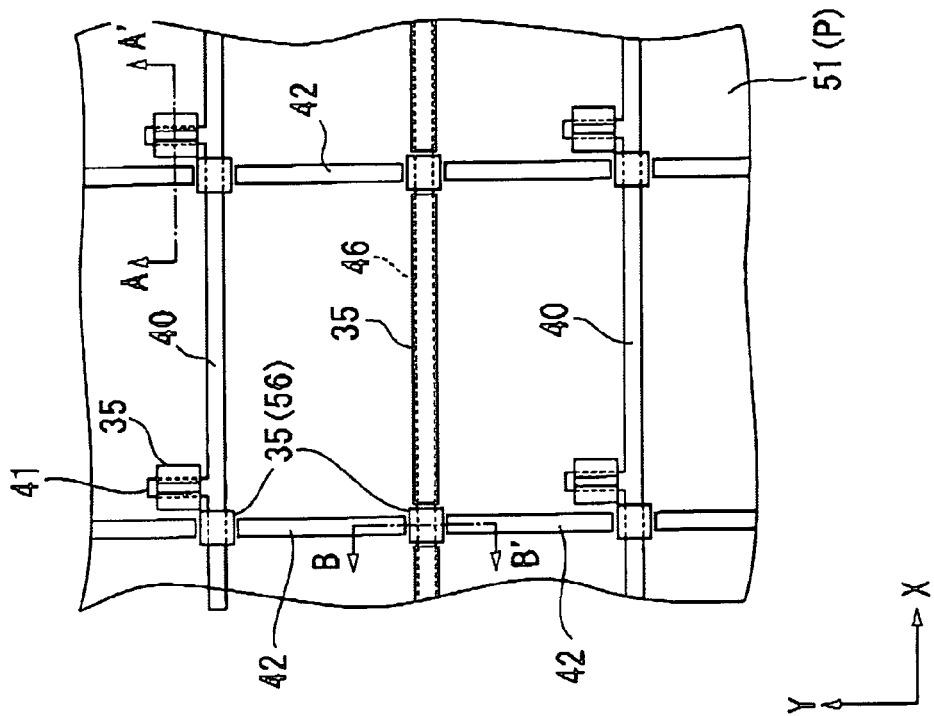

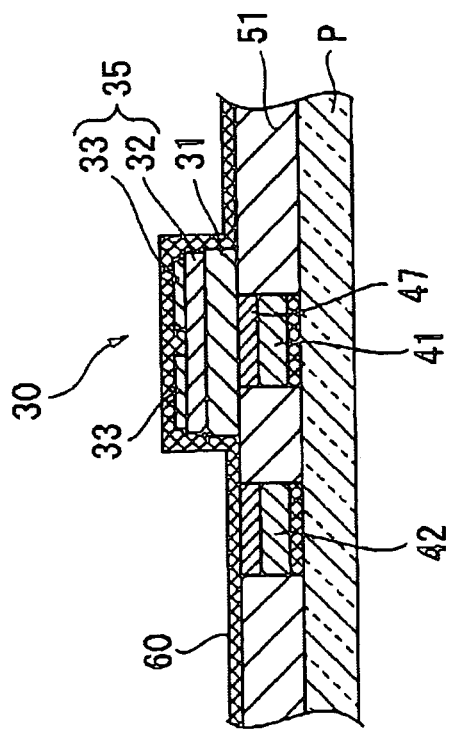
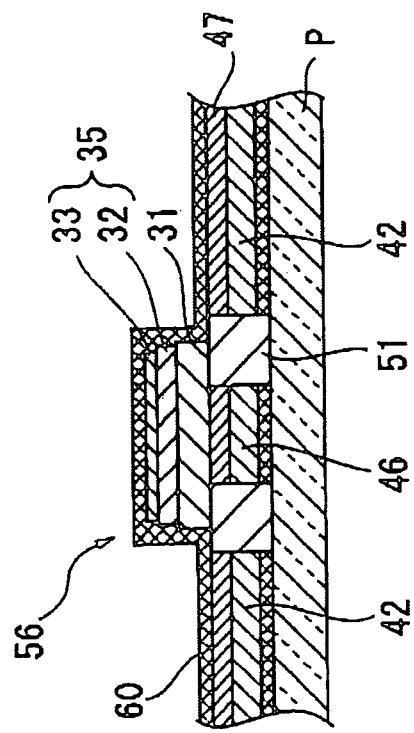
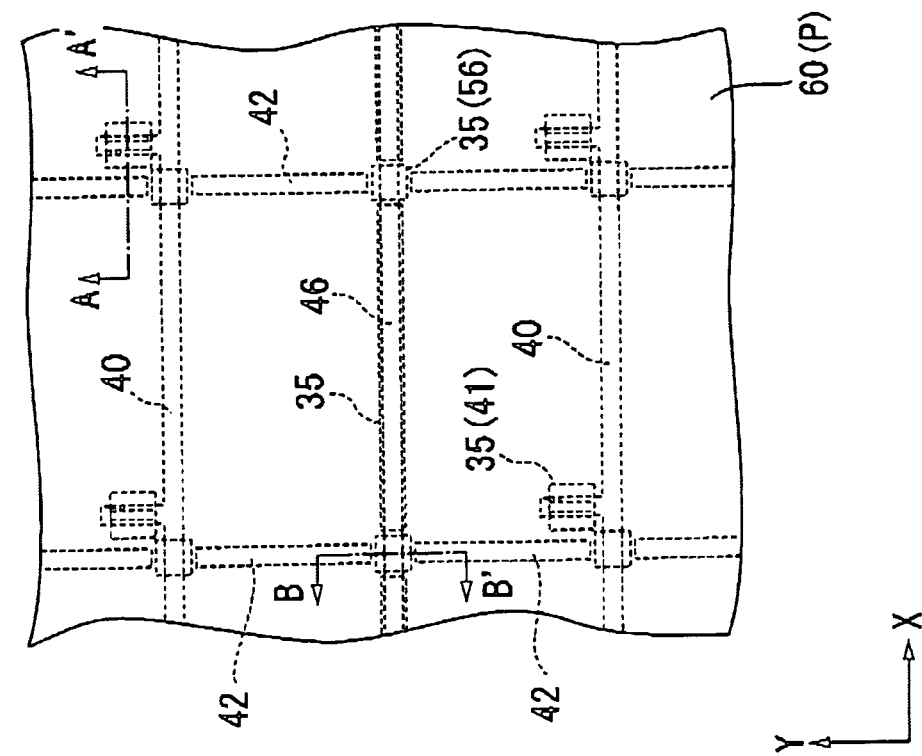

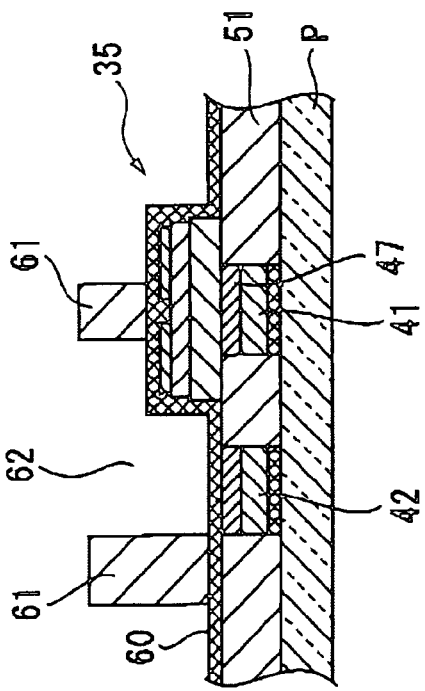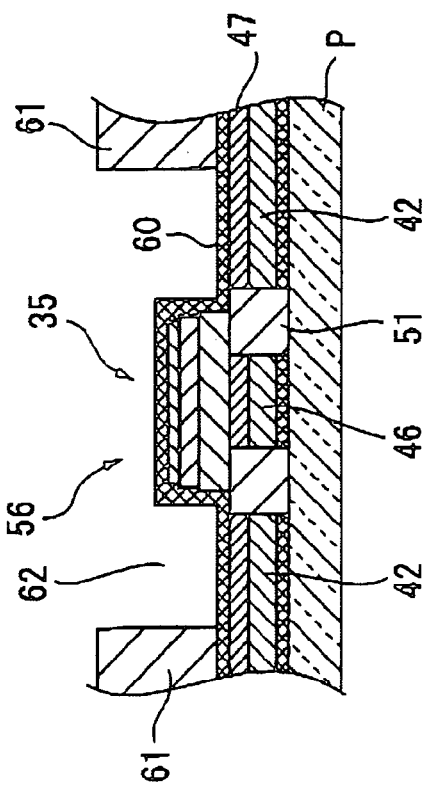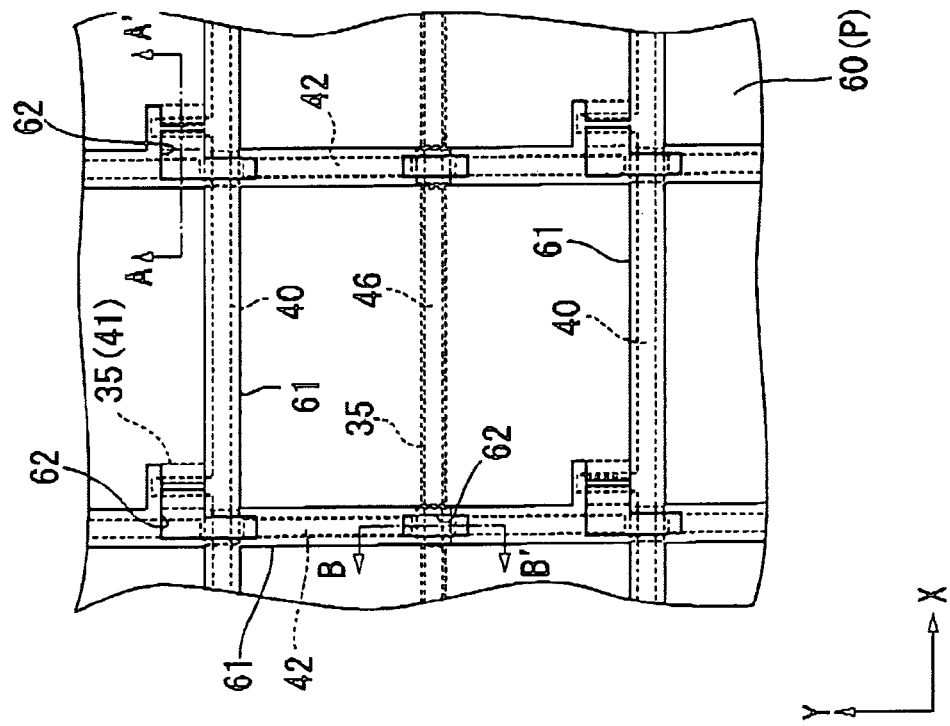

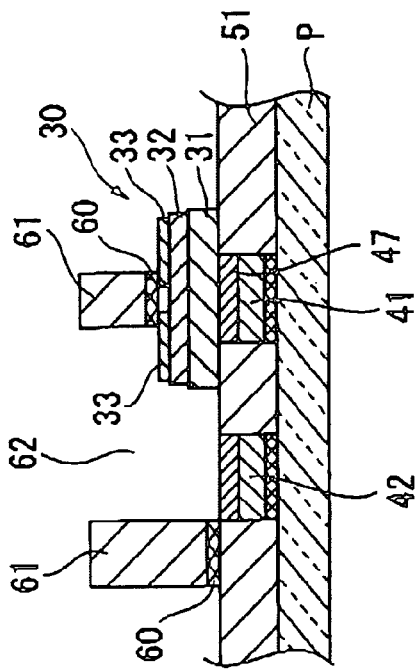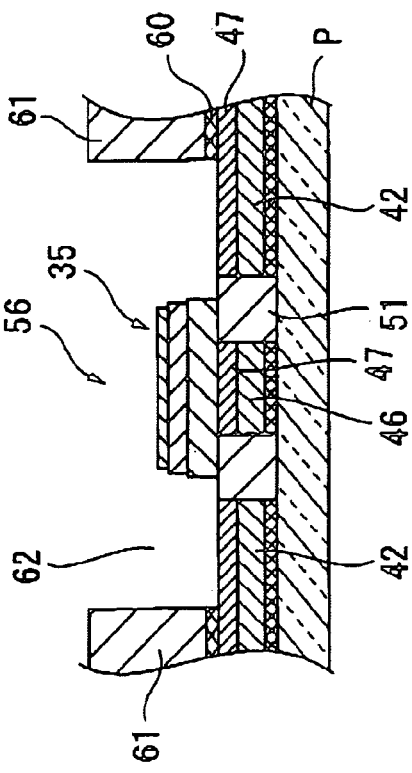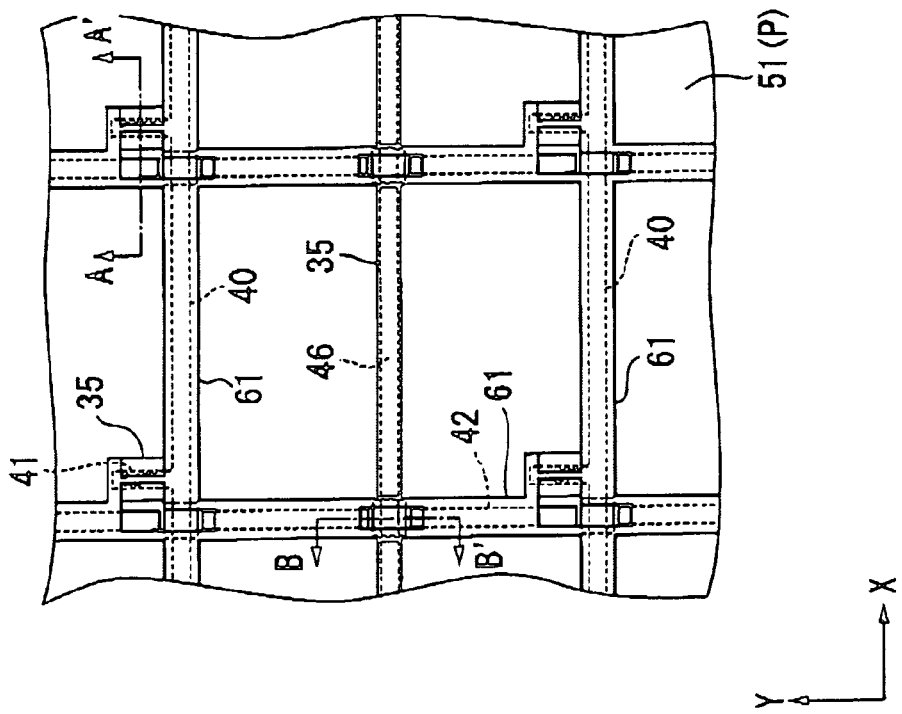

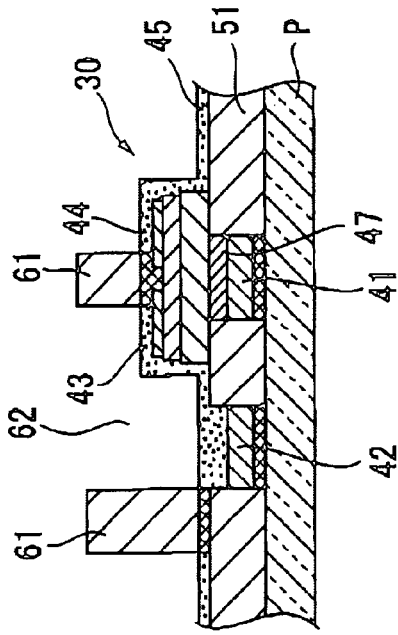
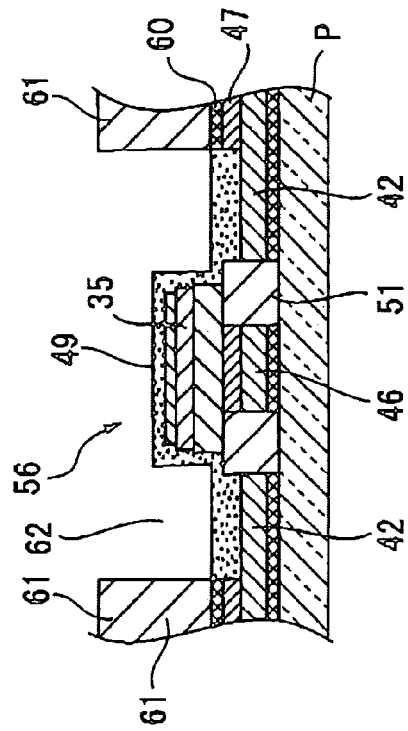
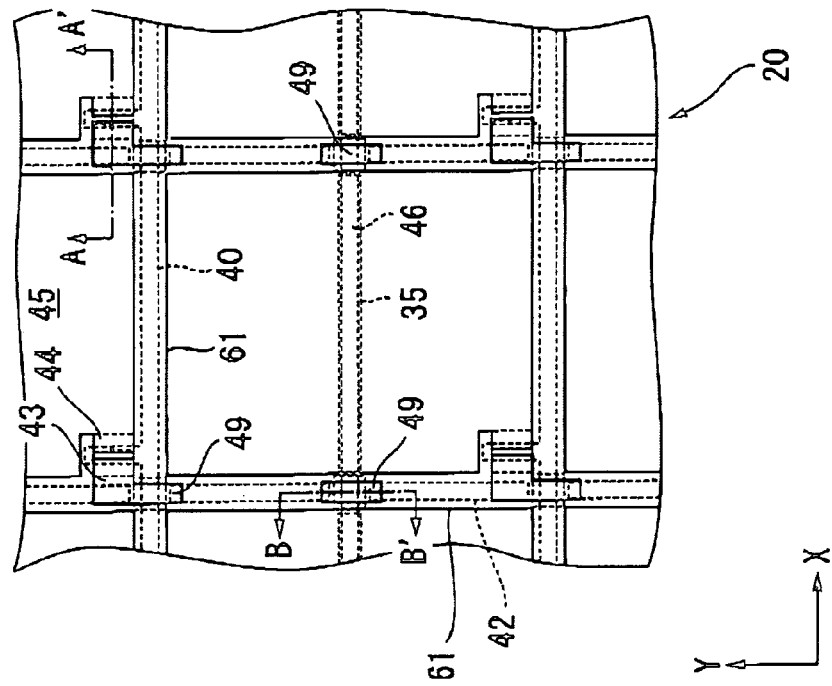

METHOD OF FORMING METAL WIRING AND METHOD OF MANUFACTURING ACTIVE MATRIX SUBSTRATE

CROSS-REFERENCE TO RELATED APPLICATION

This application claims priority from Japanese Patent Application No. 2006-074195, filed Mar. 17, 2006, and Japanese Patent Application No. 2006-318701, filed Nov. 27, 2006, the contents of which are incorporated herein by reference.

BACKGROUND

1. Technical Field

The present invention relates to a method of forming a metal wiring and a method of manufacturing an active matrix substrate.

2. Related Art

As portable devices such as notebook PCs and cellular phones are becoming common, thin and lightweight liquid crystal display devices, etc. are becoming widely used.

In such liquid crystal display devices, etc., a liquid crystal layer is sandwiched between an upper substrate and a lower substrate.

An example of the lower substrate (active matrix substrate) is shown in FIG. 18.

As shown in FIG. 18, the lower substrate 1 includes a glass substrate 2, a gate scanning electrode 3, a source electrode 4, a drain electrode 5, a pixel electrode 6 (ITO), insulating layers 7, and a Thin Film Transistor 8 (TFT).

The gate scanning electrode 3 and the source electrode 4 are disposed such that one crosses over the other.

The drain electrode 5 is disposed also on the glass substrate 2.

The pixel electrode 6 (ITO) is connected to the drain electrode 5.

One insulating layer 7 is interposed between the gate scanning electrode 3 and the source electrode 4.

The TFT 8 is made of a thin film semiconductor.

In the formation of each metal wire on the lower substrate 1 above, a technique as disclosed in, for example, Japanese Patent No. 3261699 is used in which a step combining a dry process with a photolithography etching is repeated a plurality of times.

In this technique, however, there are problems in that the material costs and the maintenance fee tend to be increased and it is difficult to increase the yielding, since the step combining a dry process with a photolithography etching is repeated a plurality of times.

As a result, in recent years, there is a growing tendency of utilizing a liquid ejection system as a coating technique for use in the manufacturing process of electronic devices.

Generally, in a coating technique based on the liquid ejection system, a liquid substance is ejected as liquid drops from a plurality of nozzles provided in a liquid drop ejection head while a substrate and the liquid drop ejection head are relatively moved. The liquid drops are repeatedly deposited on the substrate to form a coating film.

The liquid drop ejection system has advantages such as in that the liquid substance is consumed with little waste and that the liquid substance can be directly applied in any pattern on the substrate without using a technique such as photolithography.

For example, in Japanese Unexamined Patent Application, First Publication No. H11-274671, Japanese Unexamined Patent Application, First Publication No. 2000-216330, Japanese Unexamined Patent Application, First Publication No. 2003-317610, etc., techniques are disclosed in which by ejecting a function liquid including a material for pattern formation from a liquid drop ejection head onto a substrate, the material is disposed (applied) on a pattern formation surface to form a fine wiring pattern of a semiconductor integrated circuit, etc.

The prior-art techniques as described above, however, have a problem such as described below.

For example, when a conductive layer of silver is formed by coating a glass substrate with silver nano ink according to the liquid drop ejection method, a foundation layer of manganese oxide, etc. is formed between the conductive layer and the glass substrate to improve a poor contact of silver with glass.

However, in the case in which the time from the applying to the baking of a silver nano ink is not managed and the glass substrate is baked after it is left standing for a given period of time, a void occurs in the silver at an interface with the manganese oxide. Thus, the degree of contact is decreased.

SUMMARY

An advantage of some aspects of the invention is to provide a method of forming a metal wiring and a method of manufacturing an active matrix substrate that improves the degree of contact of a conductive layer with a foundation layer.

A first aspect of the invention provides a method of forming a metal wiring including: forming a foundation layer on a substrate; applying a solution including fine metal particles and a dispersion stabilizer on the foundation layer, and heating the applied solution to form into a conductive layer. In this method, after the applying of the solution, the conductive layer is formed by starting the heating of the applied solution within a determined time.

By heating the solution, the dispersion stabilizer is released from the fine metal particles and the fine metal particles coagulate to start particle growth.

Here, if the fine metal particles in contact with the foundation before staring a particle growth go into the foundation layer to increase the degree of contact of the conductive layer by the anchoring effect.

However, when an amount of the dispersion stabilizer that remains in the vicinity of the interface with the foundation layer is large, the fine metal particles grow before they go into the foundation layer because of the presence of the dispersion stabilizer, thus becoming unable to go into the foundation layer.

Since a fine metal particle has a high surface tension, it has accordingly a large contact angle with respect to the foundation angle. As a result, a void (airspace portion) occurs in the interface with the foundation layer, which decreases the degree of contact.

An amount of the dispersion stabilizer in the vicinity of the interface between the foundation layer and the solution increases in accordance with the time elapsed from when the solution is applied on the foundation.

In the method of forming a metal wiring, the heat-treatment is started before the amount of the dispersion stabilizer in the vicinity of the interface between the foundation and the solution exceeds a predetermined amount. Therefore, it is possible to allow the fine metal particles to go into the foundation layer to increase the degree of contact with the conductive layer.

Thus, in this invention, since the conductive layer is formed by starting the heating of the applied solution within a determined time after the applying of the solution, it is possible to increase the degree of contact with the conductive layer.

It is preferable that, in the method of forming a metal wiring of the first aspect of the invention, after the applying of the solution, the conductive layer be formed by sting the heating of the applied solution within ten minutes.

It is preferable that, in the method of forming a metal wiring of the first aspect of the invention, after the applying of the solution, the conductive layer be formed by starting the heating of the applied solution within five minutes.

In this manner, it is possible to further increase the degree of contact with the conductive layer.

It is preferable that, in the method of forming a metal wiring of the first aspect of the invention, the fine metal particles be made of one or a mixture selected from the group consisting of Au, Ag, Ni, Al, ITO, Pd, Bi, Cu and Mn.

It is preferable that, in the method of forming a metal wiring of the first aspect of the invention, the forming of the foundation layer include: applying a liquid substance including a foundation forming material on the substrate; and heating at a temperature at which the liquid substance is in a partially crystallized state.

As a result, in this invention, the fine metal particles as a material for forming the conductive layer go into the foundation layer. Therefore, the anchoring effect is obtained to allow an improvement in the degree of intimate contact of the conductive layer.

It is preferable that, in the method of forming a metal wiring of the first aspect of the invention, the heat-treatment be performed under a nitrogen atmosphere.

As a result, in this invention, for example when silver is used for the fine metal particles, growth of silver that would occur as particles if heated under an atmosphere with oxygen is suppressed.

A second aspect of the invention provides a method of manufacturing an active matrix substrate including: a first step of forming a gate wire on a substrate; a second step of forming a gate insulating film on the gate wire; a third step of laminating a semiconductor layer via the gate insulating film; and a fourth step of forming a source electrode, a drain electrode, and a pixel electrode on the gate insulating layer. In this method, the first step further includes: forming a foundation layer on the substrate; applying a solution including fine metal particles and a dispersion stabilizer on the foundation layer, and heating the applied solution to form into the gale wire. In this first step, after the applying of the solution, the gate wire is formed by starting the heating of the applied solution within a determined time.

Therefore, according to a method of manufacturing an active matrix substrate of this invention, the degree of contact between the gate wire and the foundation layer is increased, and thus a high-quality active matrix substrate is obtainable.

It is preferable that, in the method of manufacturing an active matrix substrate of the second aspect of the invention, the fine metal particles be made of one or a mixture selected from the group consisting of Au, Ag, Ni, Al, ITO, Pd, Bi, Cu, and Mn.

It is preferable that, in the method of manufacturing an active matrix substrate of the second aspect of the invention, the forming of the foundation layer include: applying a liquid substance including a foundation forming material on the substrate; and heating at a temperature at which the liquid substance is in a partially crystallized state.

As a result, in this invention, the fine metal particles go into the foundation layer. Therefore, the anchoring effect is obtained to allow an improvement in the degree of inmate contact between the gate wire and the foundation film.

It is preferable that, in the method of manufacturing an active matrix substrate of the second aspect of the invention, the heat-treatment be performed under a nitrogen atmosphere.

As a result, in this invention, for example when silver is used for the fine metal particles, growth of silver that would occur as particles if heated under an atmosphere with oxygen is suppressed.

BRIEF DESCRIPTION OF THE DRAWINGS

FIGS. 5A to 5C are drawings of a process for manufacturing an active matrix substrate.

FIGS. 7A and 7B are drawings showing a process for manufacturing an active matrix substrate.

FIGS. 10A to 10C are drawings showing a process for manufacturing an active matrix substrate.

FIGS. 11A to 11C are drawings showing a process for manufacturing an active matrix substrate.

FIGS. 12A to 12C are drawings showing a process for manufacturing an active matrix substrate.

FIGS. 13A to 13C are drawings showing a process for manufacturing an active matrix substrate.

FIGS. 14A to 14C are drawings showing a process for manufacturing an active matrix substrate.

DESCRIPTION OF EXEMPLARY EMBODIMENTS

Hereunder is a description of embodiments of a method of forming a metal wiring of this invention with reference to FIGS. 1 to 17C.

First, an active matrix substrate having a metal wiring will be described that is formed by the method of forming a metal wiring according to this invention.

Active Matrix Substrate

Figure 1:
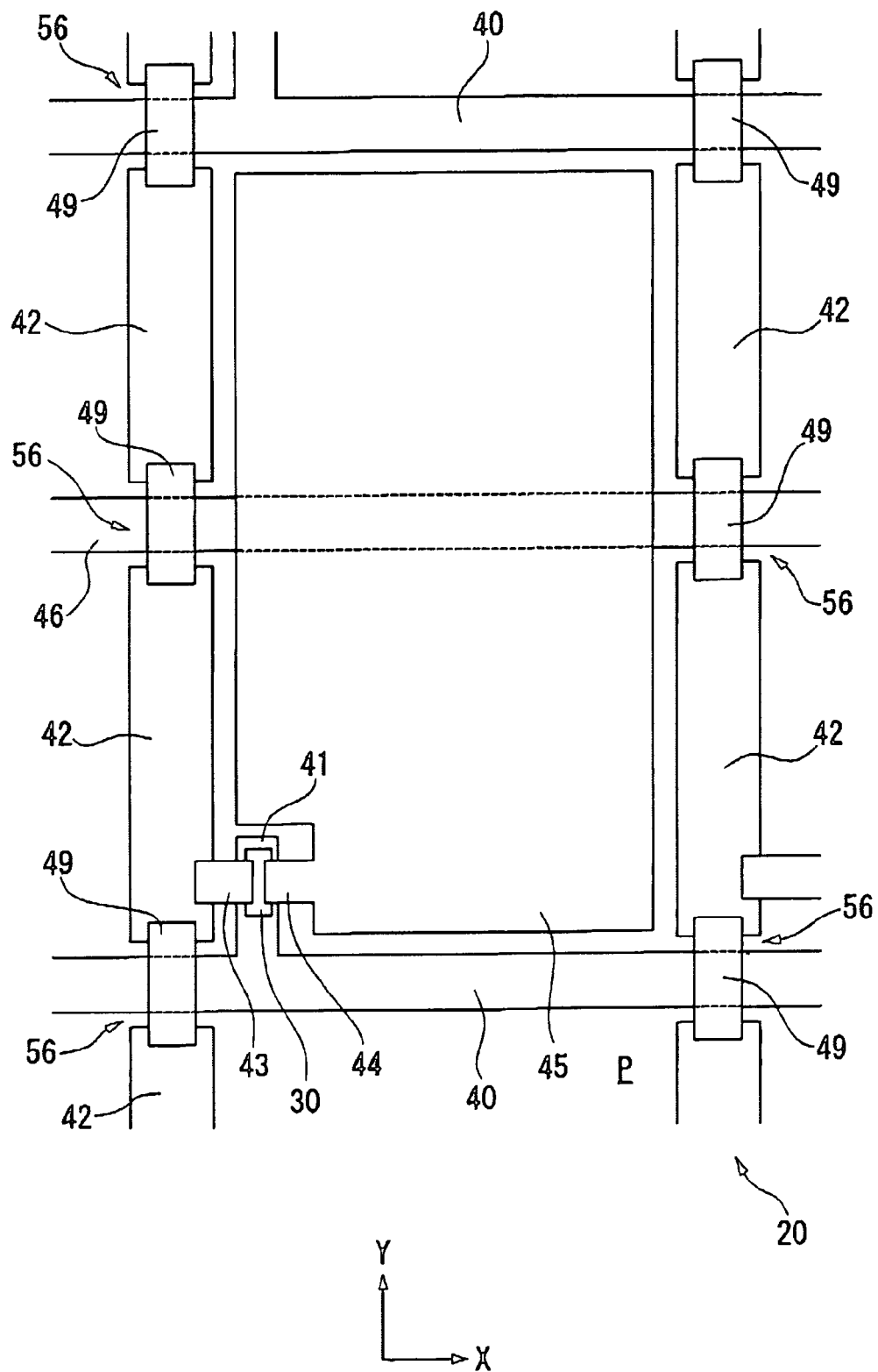
FIG. 1 is a plan view of an enlarged part of an active matrix substrate.

FIG. 1 is an enlarged view of a part of an active matrix substrate according to this invention.

The active matrix substrate 20 (device) includes thereon gate wires 40 and source wires 42 disposed in a lattice.

In other words, a plurality of the gate wires 40 are formed so as to extend in the X direction, and a plurality of the source wires 42 are formed so as to extend in the Y direction.

A gate electrode 41 is connected to the gate wire 40 as a part of the gate wire 40. The gate electrode 41 is narrower that the gate wire 40.

A TFT 30 (switching element) is disposed on the gate electrode 41 via an insulating layer.

On the other hand, a source electrode 43 is connected to the source wire 42.

One end of the source electrode 43 is connected to the TFT 30.

A pixel electrode 45 is disposed in the region surrounded by the gate wires 40 and the source wires 42.

The pixel electrode 45 is connected to the TFT 30 via a drain electrode 44.

A capacitance line 46 is disposed on the active matrix substrate 20 so as to be in parallel with the gate wires 40.

The capacitance line 46 is disposed on a lower layer of the pixel electrode 45 and the source wires 42 via an insulating layer.

The gate wires 40, the gate electrode 41, the source wires 42, and the capacitance line 46 are formed by the method of forming a metal wiring according to this invention. They are formed on the same surface.

Figure 2:
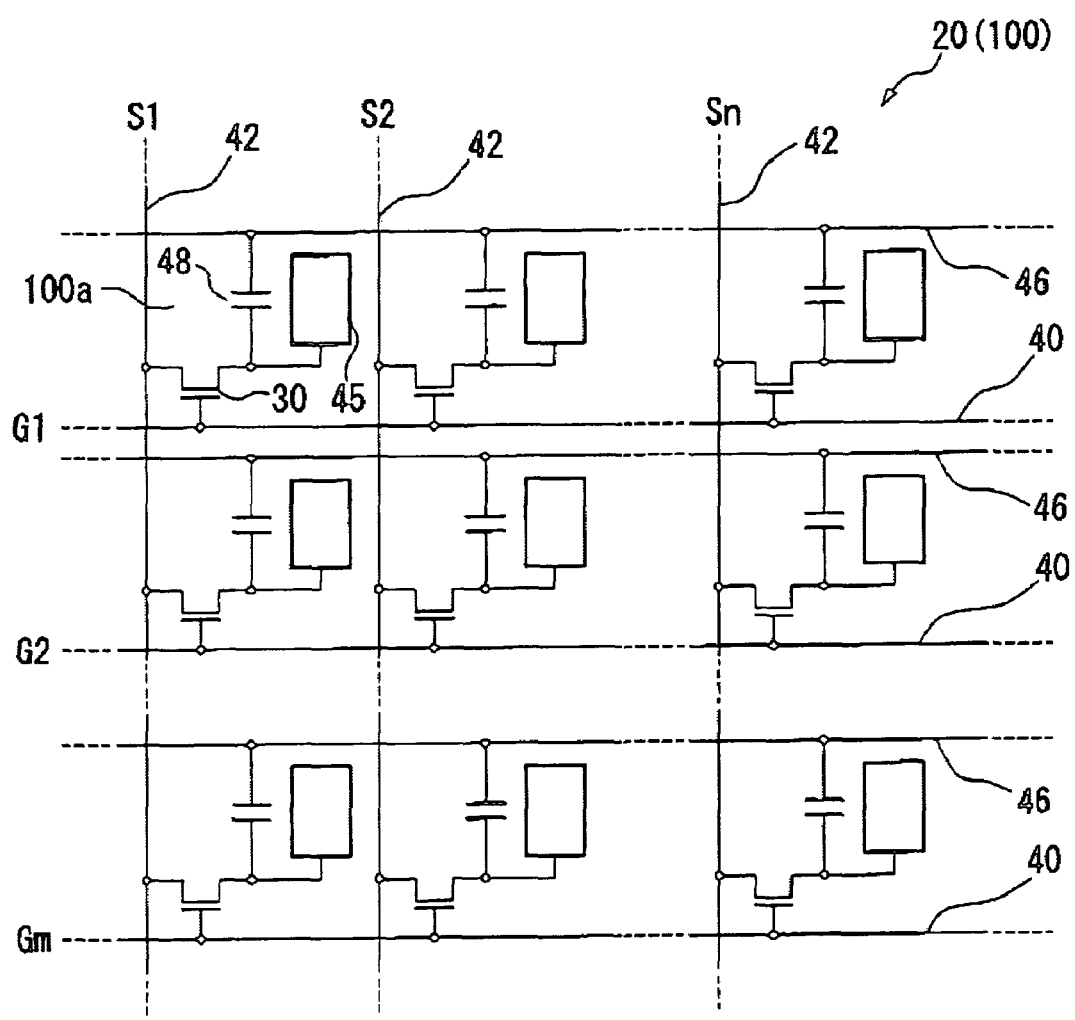
FIG. 2 is an equivalent circuit diagram of the active matrix substrate.

FIG. 2 is an equivalent circuit diagram of the active matrix substrate 20, showing the case in which the active matrix substrate 20 is used in a liquid crystal display device.

When the active matrix substrate 20 is used in a liquid crystal display device, a plurality of pixels 100a are formed in a matrix in an image display region.

In each of the pixels 100a, a TFT 30 for pixel switching is formed.

Each of the source wires 42 for supplying pixel signals S1, S2, . . . , Sn is electrically connected to a source region of the TFT 30 via the source electrode 43 shown in FIG. 1.

The pixel signals S1, S2, . . . , Sn to be supplied to the source wires 42 may be supplied line-by-line in this order, or may be supplied to groups of adjacent source wires 42 on a group-by-group basis.

One gate wire 40 is electrically connected to a gate of the TFT 30 via the gate electrode 41 shown in FIG. 1.

In predetermined timing, scan signals G1, G2, . . . , Gm are pulsewise applied to the gate wires 40 line-by-line in this order.

A pixel electrode 45 is electrically connected to a drain region of the TFT 30 via the drain electrode 44.

By turning on the TFTs 30 as switching elements for a fixed period of time, the pixel signals S1, S2, . . . , Sn supplied from the source wires 42 are written to individual pixels in a predetermined timing.

Figure 16:
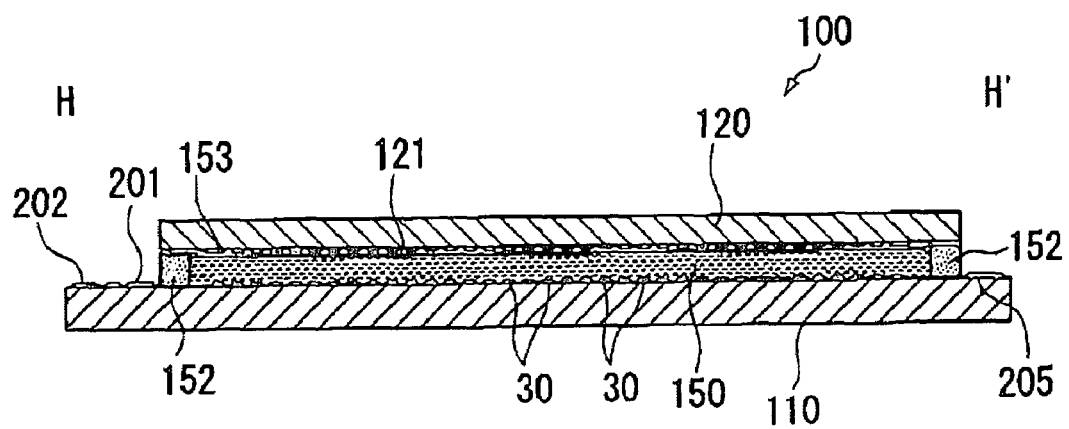
FIG. 16 is a cross-sectional view of a liquid crystal display device.

The pixel signals S1, S2, . . . , Sn at a predetermined level thus written to the liquid crystal via the pixel electrodes 45 are retained for a fixed period of time between an opposite substrate 120 and an opposite electrode 121 shown in FIG. 16.

To prevent each of the retained pixel signals S1, S2, . . . , Sn from leaking, by arranging the capacitance line 46, a storage capacitor 48 is added in parallel with a liquid crystal capacitor formed between the pixel electrode 45 and the opposite electrode 121.

For example, a voltage of the pixel electrode 45 is retained by the storage capacitor 48 for a period of time three digits longer than a period of time over which a source voltage is applied.

As a result, a retention characteristic of electric charge is improved. Thus, a liquid crystal display device 100 (electro-optical device) having a high contrast ratio is realized.

Liquid Drop Ejection Apparatus

Next, a liquid drop ejection apparatus for use in the manufacture of the above-described active matrix substrate 20 will be described with reference to FIGS. 3 and 4.

Figure 3:
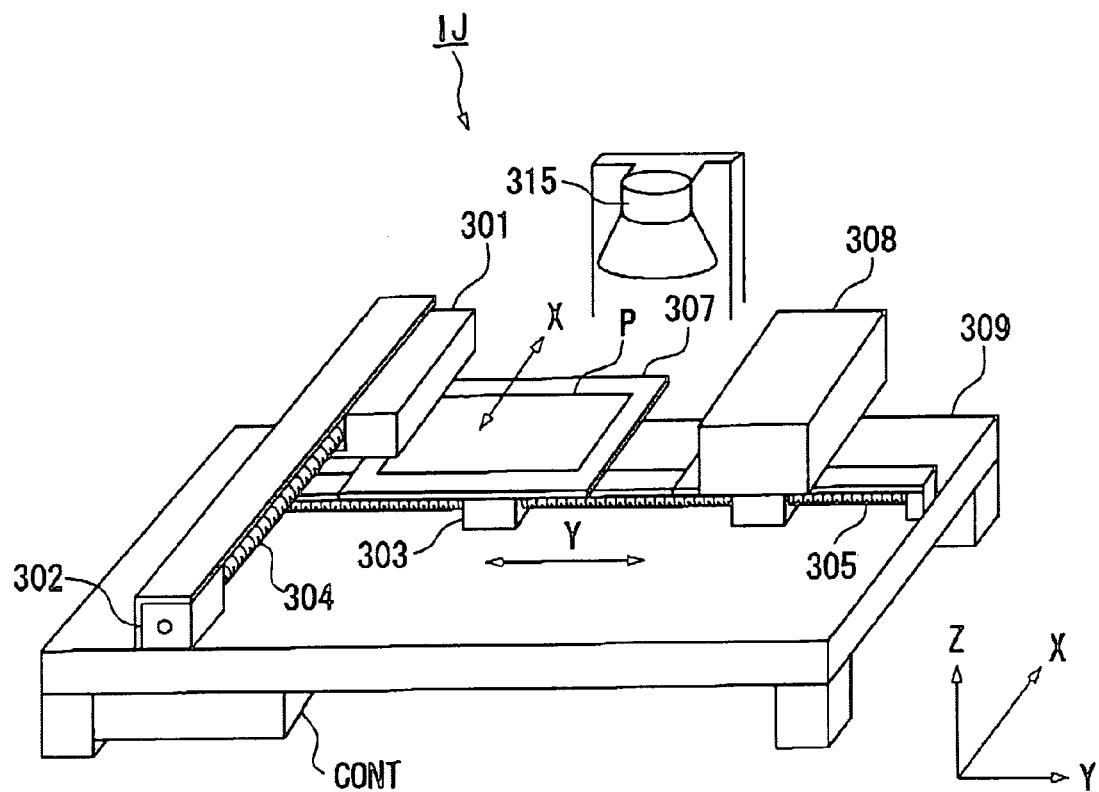
FIG. 3 is a schematic perspective view of a liquid drop ejection apparatus.

As shown in FIG. 3, a liquid drop ejection apparatus IJ (ink jet apparatus) ejects (drops) liquid drops from a liquid drop head to a substrate P.

The liquid drop ejection apparatus IJ includes a liquid drop ejection head 301, an X direction drive axis 304, a Y direction guide axis 305, a controller CONT, a stage 307, a cleaning mechanism 308, a base 309, and a heat 315.

The stage 307 supports the substrate P to be provided with an ink (liquid material, liquid substance) by the liquid drop ejection apparatus IJ. The stage 307 includes a fixation mechanism (not shown) that fixes the substrate P in a reference position.

The liquid drop ejection head 301 is a multi-nozzle type liquid drop ejection head provided with a plurality of ejection nozzles. The longitudinal direction and Y axis direction of the liquid drop ejection head 301 coincide.

The plurality of ejection nozzles are formed in the bottom surface of the liquid drop ejection head 301 in rows, in the Y axis direction, spaced apart at a fixed distance.

An ink including fine conductive particles is ejected from the ejection nozzles of the liquid drop ejection head 301 to the substrate P supported on the stage 307.

An X direction drive motor 302 is connected to the X direction drive axis 304.

The X direction drive motor 302 is a stepping motor, etc. When supplied with a drive signal for the X direction by the controller CONT, the X direction drive motor 302 rotates the X direction drive axis 304.

When the X direction drive axis 304 is rotated, the liquid drop ejection head 301 moves in the X axis direction.

The Y direction guide axis 305 is fixed so as not to move with respect to the base 309.

The stage 307 is provided with a Y direction drive motor 303.

The Y direction drive motor 303 is a stepping motor, etc. When supplied with a drive signal for the Y direction by the controller CONT, the stage 307 moves in the Y direction.

The controller CONT supplies a voltage for controlling liquid drop ejection to the liquid drop ejection head 301.

Furthermore, the controller CONT supplies a drive pulse signal for controlling the movement in the X direction of the liquid drop ejection head 301 to the X direction drive motor 302, and supplies a drive pulse signal for controlling the movement in the Y direction of the stage 307 to the Y direction drive motor 303.

The cleaning mechanism 308 cleans the liquid drop ejection head 301.

The cleaning mechanism 308 is provided with a drive motor for the Y direction (not shown).

The cleaning mechanism moves along the Y direction guide axis 305 by means of drive from the drive motor for the Y direction.

The movement of the cleaning mechanism 308 is also controlled by the controller CONT.

The heater 315 herein is used for hearing the substrate P by lamp annealing. The heater 315 evaporates and dries the solvent included in the liquid material applied on the substrate P.

Turning on and off of the heater 315 is also controlled by the controller CONT.

The liquid drop ejection apparatus IJ ejects liquid drops to the substrate P while relatively scanning the liquid drop ejection head 301 and the stage 307 for supporting the substrate P.

Here, in the description below, the X direction is referred to as a scanning direction, and the Y direction that is perpendicular to the X direction is referred to as a non-scanning direction.

Therefore, the ejection nozzles of the liquid drop ejection head 301 are provided in lines, spaced apart at a fixed distance, in the Y direction, that is, the non-scanning direction.

In FIG. 3, the liquid drop ejection head 301 is disposed perpendicularly to the traveling direction of the substrate P. However, the liquid drop ejection head 301 may be arranged to be intersected with the traveling direction of the substrate P by adjusting the angle of the liquid drop ejection head 301.

As a result, adjustment of the angle of the liquid drop ejection head 301 allows adjustment of pitches between the nozzles.

Such that a distance between the substrate P and the nozzle face is adjustable to any value may be configured.

Figure 4:
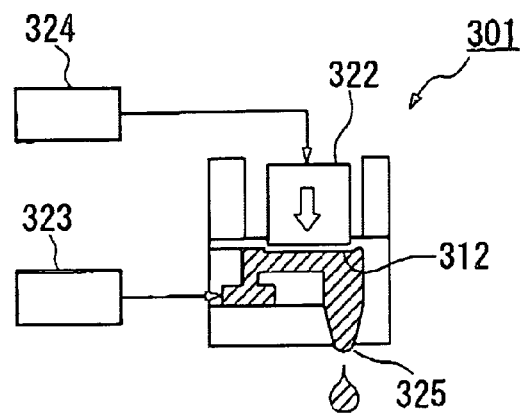
FIG. 4 is a cross-sectional view of a liquid drop ejection head.

FIG. 4 is a cross-sectional view of the liquid drop ejection head 301.

In the liquid drop ejection head 301, a piezo element 322 is disposed adjacent to a liquid chamber 312 that stores a liquid material (ink for wiring, etc.).

The liquid material is supplied to the liquid chamber 312 via a liquid supply system 323 including a material tank that stores the liquid material.

The piezo element 322 is connected to a drive circuit 324. A voltage is applied to the piezo element 322 via the drive circuit 324 to deform the piezo element 322. This, in turn, deforms the liquid chamber 312 to eject the liquid material from a nozzle 325.

In this case, the amount of deformation of the piezo element 322 is controlled by changing the value of the applied voltage.

Furthermore, the speed of deformation of the piezo element 322 is controlled by changing the frequency of the applied voltage.

Liquid ejection by the piezo system has an advantage in that it is difficult to affect the composition of a material, since heat is not applied to the material.

As ejection techniques for method of ejecting a liquid drop, a charging control system, a pressurized vibration system, an electro-mechanical transformation system, an electro-thermal transformation system, an electrostatic attraction system, etc. can be adopted.

The charging control system is one in which an electric charge electrode imparts electric charge to a material and a deflection electrode controls an ejecting direction of the material to eject the material from a nozzle.

The pressurized vibration system is one in which, for example about 30 kg/cm$^2$ of super high pressure is applied to a material and the material is ejected on the tip of a nozzle. In this system, when a control voltage is not applied, the material goes straight to be ejected from the nozzle. When the control voltage is applied, electrostatic repulsion is induced in the material and the material is scattered to be prevented from being ejected from the nozzle.

The electro-mechanical transformation system is one that utilizes a characteristic of a piezo element (piezoelectric element) to be deformed on receiving a pulse-like electric signal. Deformation of the piezo element imparts pressure via a flexible material to a space where a material is stored, and the material is pressed out of the space to be ejected from a nozzle.

The electro-thermal transformation system is one in which a material is abruptly vaporized, by a heater provided in a space where the material is stored, to generate bubbles, and the material in the space is ejected by the pressure of the bubbles.

The electrostatic attraction system is a system in which a very small pressure is applied to the inside of a space where a material is stored, to form a meniscus of the material in a nozzle and, in this condition, electrostatic attraction is applied to draw out the material.

Other than these, techniques such as a system that utilizes change in viscosity of fluid by an electric field and a system in which a material is ejected by a discharge spark are also applicable.

The method of ejecting a liquid drop has advantages in that little is wasted in the use of material and that a desired amount of the material is exactly disposed in a desired position.

An amount of a drop of a liquid material (fluid substance) ejected by the method of ejecting a liquid drop is, for example, 1 to 300 nano grams.

As fine conductive particles (fine metal particles) included in a solution to be ejected as liquid drops, for example, Au, Ag, Ni, Al, ITO, Pd, Bi, Cu, Mm, or a mixture of these is used.

These fine conductive particles may be used with the surface thereof being applied with an organic substance, etc. to increase dispersibility.

It is preferable that the fine conductive particle have a diameter greater than 1 nm and less than 0.1 μm.

If the diameter is greater than 0.1 μm, the liquid drop ejection heat described later may cause a clogging in the nozzle.

If the diameter is less than 0.1 nm, the volume ratio of the applying material to the fine conductive particles becomes large and the ratio of the organic substance in the obtained film becomes too large.

To prevent the fine conductive particles from coming into contact with one another to coagulate, a dispersion stabilizer is added.

As a dispersion stabilizer, for example, an amine compound such as an alkylamine is used.

The dispersion stabilizer is required to be able to finally evaporate together with a dispersion solvent after being released from the surface of the fine metal particles. It is preferable that the dispersion stabilizer have a boiling point in a range not exceeding 300° C., normally in the range of 250° C. or lower.

For example, let dispersion stabilizer be the alkylamine, the alkyl group thereof is selected from the range of C8 to C18, and the one having an amino group at the end of the alkyl chain is used.

For example, the above-mentioned alkylamine in the range of C8 to C18 has thermal stability, and has a not-so-high vapor pressure at or near room temperature. Thus, it is easy to maintain and control the content of the alkylamine in a desired range when the alkylamine is stored at room temperate, etc. Therefore, the alkylamine is preferably used from a viewpoint of handling ability.

The dispersion medium (solution) is not particularly limited as long as it can disperse the above-mentioned fine conductive particles and does not bring about coagulation.

As a dispersion medium, examples other than water may be listed as follows: alcohols such as methanol, ethanol, propanol, and butanol; compounds based on carbon hydrate such as n-heptane, n-octane, decane, dodecane, tetradecane, toluene, xylene, cymene, durene, indene, dipentene, tetrahydronaphtalene, decahydronaphthalene, and cyclohexylbenzene; compounds based on ether such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, and p-dioxane; and polar compounds such as propylene carbonate, γ-butyrolactone, N-methyl-2-pyrrolidone, dimethylformamide, dimethyl sulfoxide, and cyclohexanone.

Among these, water, alcohols, compounds based on carbon hydrate, compounds based on ether are preferable from the viewpoint of dispersibility of the fine particles and stability of the dispersion liquid, and easiness in applicability to the method of ejecting a liquid drop (ink jet method). As more preferable dispersion media, water and compounds based on carbon hydrate can be listed.

It is preferable that a dispersion liquid of fine conductive particles have a surface tension in the range of, for example, greater than 0.02 N/m and less man 0.07 N/m.

In ejecting a liquid by the ink jet method, when the surface tension is less than 0.02 N/m, wet characteristics of the ink composition to the nozzle face increases, which tends to cause a trajectory deflection. On the other hand, when the surface tension is greater than 0.07 N/m, the shape of the meniscus at the tip of the nozzle is not stable, and it is difficult to control the ejection amount or the ejection timing.

To adjust the surface tension, it is preferable that the above-mentioned dispersion liquid be added with a very small amount of surface tension adjuster based on fluorine, silicone, nonion, etc., within a range that does not largely decrease the contact angle to the substrate.

The surface tension adjuster based on nonion increases the wet characteristics of the liquid to the substrate, improves the levelness of the film, and serves to prevent the occurrence of minute asperities on the film, etc.

The above-mentioned surface tension adjuster may include organic compounds such as alcohol, ether, ester, and ketone as required.

It is preferable that the dispersion liquid have a viscosity of, for example, greater than 1 mPa·s and less than 50 mPa·s.

In ejecting a liquid material as liquid drops by means of the ink jet method, when the viscosity is less than 1 mPa·s, the peripheral region of the nozzles is likely to be contaminated by an outflow of the ink. On the other hand, when the viscosity is great than 50 mPa·s, clogging of the nozzle holes occurs more frequently, preventing smooth ejection of the liquid drops.

Method of Manufacturing Active Matrix Substrate

Next, a method of manufacturing an active matrix substrate 20 including a method of forming a metal wiring according to this invention will be described with reference to the drawings.

The active matrix substrate 20 is manufactured by sequentially performing: a first step of forming a lattice-patterned wiring on a substrate P; a second step of forming a laminate portion 35; and a third step of forming a pixel electrode 45, etc.

Hereunder is a detailed description of each step.

First Step: Wiring Formation

FIGS. 5A to 7B are drawings for describing a wiring formation step (metal wiring formation step) as the first step.

FIG. 5B is a cross-sectional view taken along the line A-A' in FIG. 5A.

FIG. 7B is a cross-sectional view taken along the line A-A' in FIG. 7A.

For the substrate P on which a lattice-patterned wiring of the gate wires 40, the source wires 42, or the like are formed, various materials such as glass, silica glass, an Si wafer, a plastic film, or a metal plate may be used.

Furthermore, any of these various material substrates on the surface of which any of a semiconductor film (semiconductor layer), a metal film, a conductive film, or the like is formed as a foundation may also be used.

First, as shown in FIGS. 5A and 5B, here, a bank 51 made of insulating organic resin is formed on the substrate P made of an alkali-free glass.

The bank is a member for disposing an ink for wiring (described later) in predetermined positions on the substrate P.

Specifically, as shown in FIG. 5A, banks 51 having a plurality of opening portions 52, 53, 54, and 55 corresponding to formation positions of the lattice pattern are formed on the top surface of the washed substrate P by the photolithography method.

As a material of the bank 51, a polymeric material such as an acrylic resin, a polyimide resin, an olefin resin, a melamine resin may be used.

Next, to remove the resist (organic substance) residue between the banks formed in the formation of the banks, the substrate P is subjected to a residue treatment.

The residue treatment may be selected from an ultraviolet (UV) beam radiation treatment that radiates an ultraviolet beam to perform the treatment, an $O_2$ plasma treatment in which oxygen is used as a treatment gas under an atmosphere of air, or the like. Here, the $O_2$ plasma treatment is performed.

Specifically, oxygen in its plasma state is radiated to the substrate P from a plasma discharge electrode.

The conditions for the $O_2$ plasma treatment are: for example, a plasma power of 50 to 1000 W; an oxygen gas flow rate of 50 to 100 ml/min a transfer speed, of the substrate P with respect to the plasma discharge electrode, of 0.5 to 10 mm/sec; and a substrate temperature of 70 to 90° C.

In the case in which the substrate P is a glass substrate, the surface thereof has a liquid affinity to the material for forming a wiring pattern. The liquid affinity of the substrate surface can be increased by performing, as in this embodiment, the $O_2$ plasma treatment or the ultraviolet beam radiation treatment for treating the residue.

Next, the bank 51 is subjected to a liquid-repellency imparting treatment for favorably disposing an ink for a wiring pattern inside the opening portions 52, 53, 54, and 55.

As a liquid-repellency imparting treatment, a $CF_4$ plasma treatment (plasma treatment using a gas constituting a fluorine) etc.

Performing such a liquid-repellency imparting treatment introduces a fluorine group into the resin constituting the bank 51, and thus the bank is provided with a high liquid-repellency.

The $O_2$ plasma treatment as a liquid-affinity imparting treatment may be performed before the formation of the bank 51. However, it is preferable that the $O_2$ plasma treatment be performed after the formation of the bank 51 since pre-treatment by $O_2$ plasma tends to make the bank 51 fluorinated (a liquid repellency is imparted to the bank 51).

The liquid-repellency imparting treatment to the bank 51 has little effect on the substrate P surface that is already subjected to the liquid-affinity imparting treatment. However, when the substrate P is made of glass, etc., introduction of a fluorine group by the liquid-repellency imparting treatment does not easily occur.

Therefore, the liquid affinity, that is, wet characteristics of the substrate P is not substantially damaged.

The bank 51 may be formed of a material that originally has a liquid-repellency (e.g., resin material having a fluorine group) to omit the liquid-repellency imparting treatment thereof.

The opening portions 52, 53, 54, and 55 formed by the bank 51 correspond to the lattice-patterned wiring made of the gate wires 40, the source wires 42, etc.

In other words, by disposing a metal material for wiring inside the opening portions 52, 53, 54, and 55 of the bank 51, the lattice-patterned wiring made of the gate wires 40, the source wires 42, etc. is formed.

Specifically, the opening portions 52 and 53 formed so as to extend in the X direction correspond to formation positions for the gate wire 40 and the capacitance line 46.

The opening portions 54 corresponding to formation positions for the gate electrodes 41 are connected to the opening portion 52 corresponding to a formation position for the gate wire 40.

The opening portions 55 formed so as to extend in the Y direction correspond to formation positions for the source wires 42.

The opening portion 55 extending in the Y direction is formed so as to be divided at an intersection 56 such that the opening portion 55 does not intersect the opening portion 52 or 53 that extends in the X direction.

An ink for wiring including fine conductive particles is ejected into and disposed inside the opening portions 52, 53, 54, and 55 using the above-described liquid drop ejection apparatus IJ to form a lattice-patterned wiring made of the gate wires 40, source wires 42, etc. on the substrate P.

As an ink for wiring, a dispersion liquid in which fine conductive particles are dispersed in a dispersion medium, or a liquid in which an organic silver compound or silver oxide nano particles are dispersed in a solvent (dispersion medium) is used.

In this embodiment, silver nano particles are used for the fine conductive particles, and a dispersion liquid with an amino compound is used for the dispersion stabilizer.

In this embodiment, as shown in FIG. 7B (in which only a gate electrode 41 and a source wire 42 are shown), a gate wire 40, a gate electrode 41, a source wire 42, and a capacitance line 46 are formed into a wiring pattern having a three-layered structure.

Specifically, in this embodiment, each of the gate wire 40, the gate electrode 41, the source wire 42, and the capacitance line 46 is composed of three layers of a manganese layer F1 (foundation layer), a silver layer F2 (conductive layer), and a nickel layer F3 (protection layer) in order from the bottom layer (layer nearest to the substrate P) to the top layer (layer farthest from the substrate P).

In the wiring thus formed into a film (formed), the manganese layer F1 acts as a foundation layer for improvement in intimate contact with the silver layer F2, and the nickel layer F3 acts as a protection layer.

The protection layer acts as a thin film for suppressing the (electro) migration phenomenon, etc. of a conductive film made of silver, copper, etc.

In the description below, the case in which the gate electrode 41 and the source wire 42 are formed into films will be described.

To form the manganese layers F1 in the above-described opening portions 54 and 55, a function liquid (liquid substance) in which manganese (Mn) as fine conductive particles is dispersed in an organic dispersion medium is first ejected dropwise from the liquid drop ejection head 301 to be disposed in predetermined positions inside the opening portions 54 and 55.

When disposed inside the opening portions 54 and 55, the liquid drops of the function liquid are ejected, by using the liquid drop ejection head 301, from above the opening portions 54 and 55 to the opening portions 54 and 55.

After the ink for wiring has been ejected to the substrate P, a dry treatment and a baking treatment are performed as required for removal of the dispersion medium (organic content).

With such dry and baking treatments, electrical contact among fine conductive particles is secured to transform the particles into a conductive film.

The dry treatment may be performed by, for example, a heating treatment by use of a normal hot plate for heating the substrate P, an electric furnace, or the like.

This dry treatment is mainly for reducing irregularities in film thickness. Heating is performed, for example, at 100° C. for five minutes.

A treatment temperature for the baking treatment is appropriately determined in consideration of the boiling point (vapor pressure) of the dispersion medium, the thermal behavior of the fine particles such as dispersibility and oxidizability, the presence or absence of and the amount of the coating material, heat resistance temperature of the base material, etc.

For example, to remove the coating material made of an organic substance, heating is performed at 180 to 215° C., more preferably at 200° C., for 30 minutes or more. When heated at 220° C. or higher, the fine particles are turned into a substantially crystallized state. Under the baking treatment conditions of this embodiment, the manganese layer F1 can be turned into a partially crystallized state (uncured state).

Figure 6A:
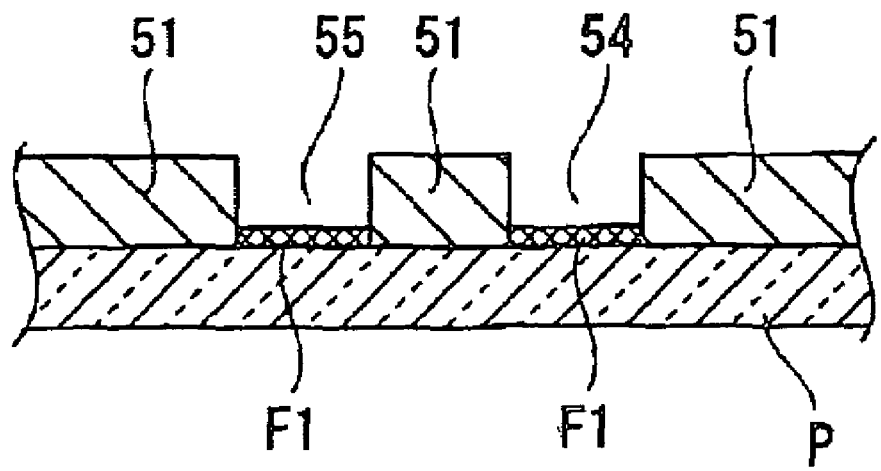
FIGS. 6A and 6B are drawings showing a process for manufacturing an active matrix substrate.

As a result, as shown in FIG. 6A, the manganese layer F1 in a partially crystallized state is formed with a thickness of about 0.01 to 0.5 µm in the opening portions 54 and 55.

Next, to form the silver layer F2, liquid drops of a function liquid in which nano particles of silver (Ag) as fine conductive particles are dispersed in an organic dispersion medium are disposed inside the opening portions 54 and 55 formed with the manganese layer F1.

In addition to the nano particles of silver, for example, a dispersion stabilizer of an amino compound is added to and dispersed in this function liquid.

On the function liquid disposed so as to coat the manganese layer F1, the dry treatment and the baking treatment are performed to remove the dispersion medium and the dispersion stabilizer.

Here, fine silver particles included in the function liquid applied on the manganese layer F1 intrude 1 into uncrystallized regions of the manganese layer F1. As a result, the degree of contact of the post-baked silver layer F2 with the manganese layer F1 is increased by the anchoring effect.

On the other hand, the dispersion stabilizer included in the applied function liquid is removed together with the dispersion medium by the heating treatment. During the time from the applying to the start of the heating treatment (waiting time from the applying of the function liquid to the start of the heating treatment), the amount of the dispersion stabilizer that comes into contact with the manganese layer F1 increases in the vicinity of an interface between the manganese layer F1 and the dispersion stabilizer.

As a result, the dispersion stabilizer covers the manganese layer F1, thus the fine silver particles going into the manganese layer F1 is prevented.

Furthermore, during the time, the fine silver particles grow to have a larger particle size. Therefore, the particles become unable to go into the manganese layer F1.

The metal film has a high surface tension, which leads to a large contact angle to the manganese layer F1 as the foundation layer. As a result, a void (airspace portion) occurs at an interface to the manganese layer F1, decreasing the degree of contact.

In this embodiment, after the function liquid is applied on the manganese layer F1, a heating treatment is started before the amount of the dispersion stabilizer that attaches to the vicinity of the interface to the manganese layer F1 increases to a predetermined amount or more.

Such a knowledge described in this embodiment has been obtained based on experimentation.

Specifically, in this experiment, it has been confirmed that when a function liquid including the above-mentioned fine silver particles and dispersion stabilizer was applied on the manganese layer F1 at room temperature (about 23° C.) and then a heating treatment was started after elapse of 10 minutes, a void was occurred in the vicinity of the interface of the silver layer F2 to the manganese layer F1, and the degree of contact is decreased.

On the other hand, it has been confirmed that when a function liquid including the similar fine silver particles and dispersion stabilizer was applied on the manganese layer F1 under the same temperature condition and then a heating treatment was started within 10 minutes, the degree of contact between the silver layer F2 and the manganese layer F1 was increased.

Therefore, in the wiring formation step of this embodiment, the heating treatment is started within 10 minutes after the function liquid is applied on the manganese layer F1.

In a similar experiment as above, it has been confirmed that when the heating treatment is started within five minutes after the function liquid is applied on the manganese layer F1, the degree of contact between the silver layer F2 and the manganese layer F1 was further increased.

Therefore, in the wiring formation step of this embodiment, the heating treatment may be started within five minutes after the function liquid is applied on the manganese layer F1 to further increase the degree of contact between the silver layer F2 and the manganese layer F1.

In the baking treatment performed on the function liquid including the fine silver particles and the dispersion stabilizer, the liquid is baked at about 220° C. for 30 minutes under an air atmosphere to remove the dispersion medium (and the dispersion stabilizer), and then a full baking is performed at about 300° C. for 30 minutes under a nitrogen atmosphere.

Silver has a property in which particles thereof grow when heated in the presence of oxygen. However, in this embodiment, the growth of the particles is suppressed since the fill baking is performed under a nitrogen atmosphere.

Figure 6B:
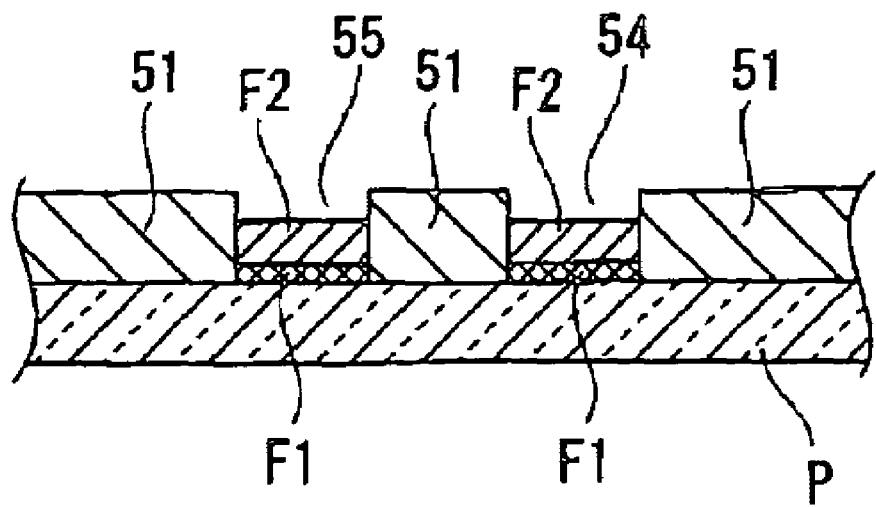
Figures 8A, 8B:
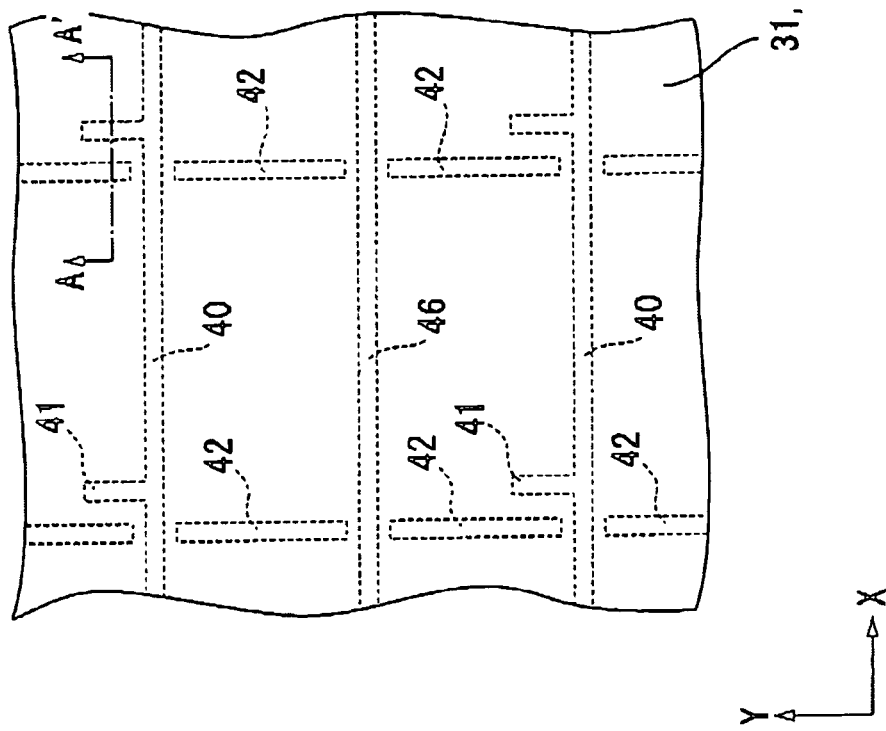
FIGS. 8A and 8B are drawings showing a process for manufacturing an active matrix substrate.

With this baking treatment, as shown in FIG. 6B, the silver layer F2 is formed into a film that is laminatedly disposed on the man manganese layer F1.

Subsequently, to form the nickel layer F3, liquid drops of a function liquid in which nickel as fine conductive particles is dispersed in an organic dispersion medium are disposed on the silver layer F2.

On the function liquid disposed, the dry treatment and the baking treatment are performed to remove the dispersion medium.

In these treatments, the dry treatment is first performed at about 70° C. for 10 minutes under an air atmosphere to prevent dry irregularities. The baking treatment is then performed at about 220° C. for 30 minutes under an atmosphere of air to remove the dispersion medium (organic content). Finally, a full baking is performed at about 300° C. for 30 minutes under a nitrogen atmosphere.

With these dry and baking treatments, as shown in FIG. 7B, the nickel layer F3 that is laminatedly disposed on the silver layer F2 is formed as a protection layer 47, and thus a gate electrode 41 and a source wire 42 are formed.

Thus, in the method of forming a metal wiring of this embodiment, the starting time of the heating treatment for forming the silver layer F2 is determined based on an amount of the dispersion stabilizer in the vicinity of the interface to the manganese layer F1. As a result, the silver nano particles go into the uncrystallized regions of the manganese layer F1 without interference from the dispersion stabilizer being attached to the manganese layer F1. Therefore, the degree of contact of the silver layer F2 with the manganese layer F1 can be increased by the anchoring effect.

Additionally, in this embodiment, the manganese layer F1 is formed into a film in an uncrystallized state (uncured grate), and the function liquid for forming the silver layer is applied on the manganese layer F1 in that state.

As a result, a better anchoring effect is obtainable and the degree contact of the silver layer F2 with the manganese layer F1 can be further increased.

In this embodiment, the heating treatment is performed under a nitrogen atmosphere. Therefore, baking under an oxygen atmosphere that is likely to cause a particle growth can be suppressed to a minimum, and a decrease in levelness of the silver layer F2 (and consequently the gate electrode 41 and the source wire 42) in accordance with the advance of the particle growth can be suppressed.

Second Step: Laminate Portion Formation

FIGS. 8A to 11C are drawings for describing the laminate formation step as the second step.

FIGS. 8B, 9B, 10B, and 11B are cross-sectional views taken along the line A-A' in FIGS. 8A, 9A, 10A, and 11A, respectively.

Figure 9B:
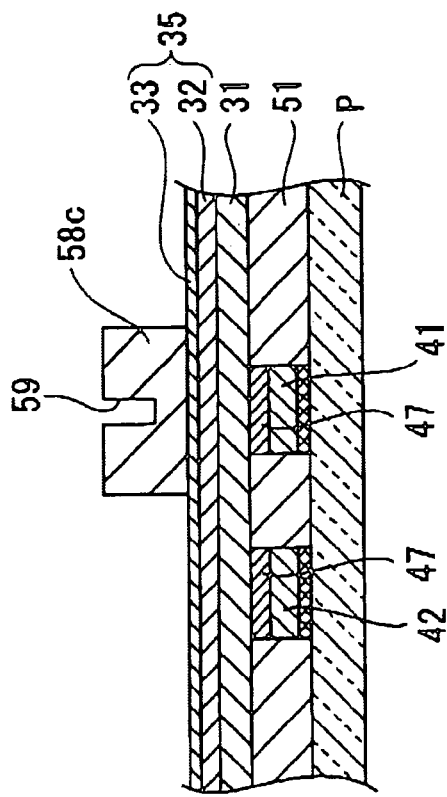
FIGS. 9A to 9C are drawings showing a process for manufacturing an active matrix substrate.
Figure 9C:
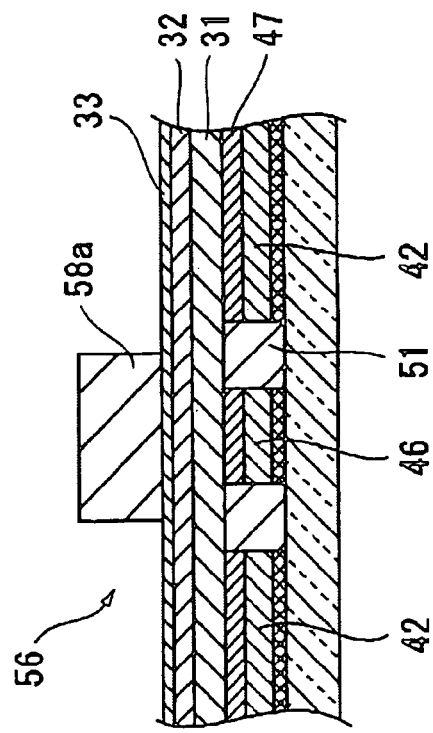
Figure 9A:
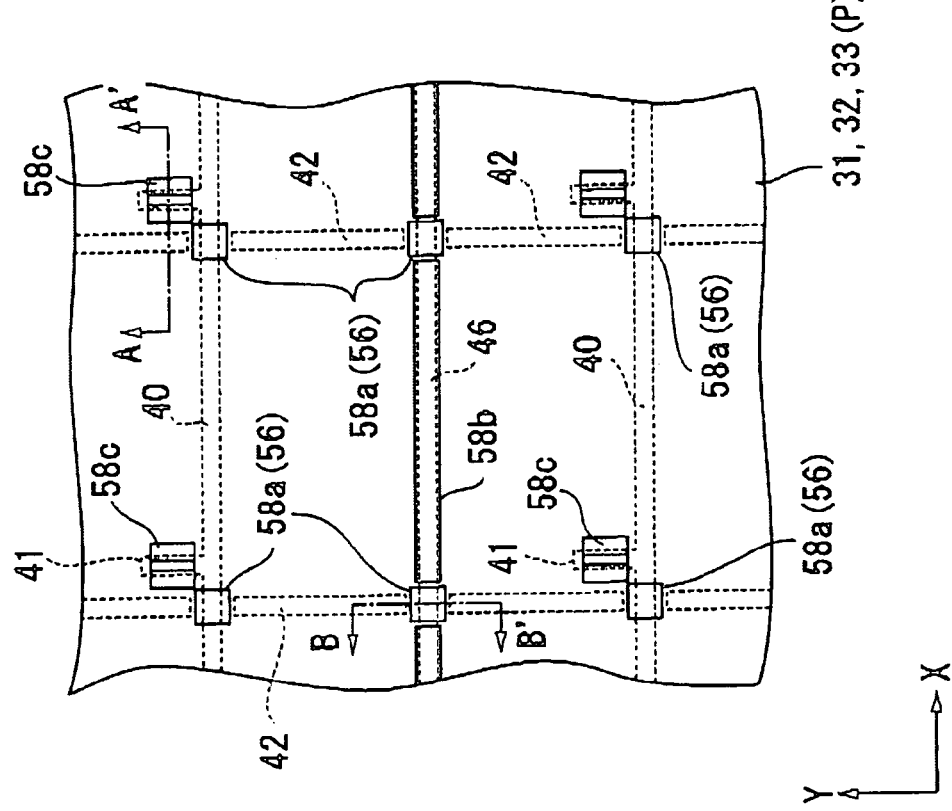

FIGS. 9C, 10C, and 11C are cross-sectional views taken along the line B-B' in FIGS. 9A, 10A, and 11A, respectively.

In the second step, an insulating film 31 (gate insulating film) and a laminate portion 35 are formed in a predetermined position on a layer composed of the bank 51 and the lattice-patterned wiring.

The laminate portion 35 is composed of a semiconductor film (a contact layer 33, an active layer 32).

More particularly, the insulating film 31, the active layer 32, and the contact layer 33 are first formed in succession on the entire surface of the substrate P by use of the plasma CVD method.

Specifically, a silicon nitride film as the insulating film 31, an amorphous silicon film as the active layer 32, and an n+ type silicon film as the contact layer 33 are sequentially formed by changing material gases and plasma conditions.

Next, as shown in FIGS. 9A, 9B, and 9C, the photolithography method is used to dispose resists 58 (58a to 58c) in predetermined positions.

Here, the predetermined positions are, as shown in FIG. 9A: positions above intersections 56 (resists 58a) between the gate wires 40 and the source wires 42; positions above the gate electrodes 41 (resists 58c); and positions above the capacitance lines 46 (resists 58b).

The resist 58a disposed above the intersection 56 and the resist 58b disposed above the capacitance line 46 are separately disposed and formed so as not to come into contact with each other.

In the resist 59c disposed above the gate electrode 41, a groove 59 is formed by performing a half exposure, as shown in FIG. 9B.

Next, an etching treatment is performed on the entire surface of the substrate P with the resists 58 (58a to 58c) as a mask to pattern the contact layer 33 and the active layer 32.

Furthermore, an etching is performed to pattern the insulating film 31.

As a result, as shown in FIGS. 10A, 10B, and 10C, the contact layer 33, the active layer 32, and the insulating film 31 are formed in positions corresponding to the positions above which the resists 58 (58a to 58c) are disposed.

Thus, in the predetermined positions where the resists 58 are disposed, the insulating film 31 and the laminate portion 35 composed of the semiconductor film (the contact layer 33, the active layer 32) are formed.

In the laminate portion 35 formed above the gate electrode 41, the groove 59 is already formed by performing a half exposure on the resist 58c. Therefore, by performing a development again before the etching, the groove is completely cut.

As shown in FIG. 10B, a portion of the contact layer 33 corresponding to the groove 59 is removed, thus dividing the contact layer 33 into two.

As a result, the active layer 32 and the contact layer 33 are formed into a TFT 30 as a switching element above the gate electrode 41.

Next, as shown in FIGS. 11A, 11B, and 11C, a silicon nitride film as a protection film 60 for protecting the contact layer 33 is formed on the entire surface of the substrate P.

In this manner, the laminate portion 35 is formed.

Third Step

FIGS. 12A to 14C are drawings for describing the third step, which is a forming step of the pixel electrodes 45, etc.

FIGS. 12B, 13B, and 14B are cross-sectional views taken along the line A-A' in FIGS. 12A, 13A, and 14A, respectively.

FIGS. 12C, 13C, and 14C are cross-sectional views taken along the line B-B' in FIGS. 12A, 13A, and 14A, respectively.

In the third step, the source electrodes 43, the drain electrodes 44, the conductive layers 49, and the pixel electrodes 45 are formed.

Any of the source electrode 43, the drain electrode 44, the conductive layer 49, and the pixel electrode 45 may be formed of a light transmissive material such as Indium Tin Oxide (ITO).

In the formation of these electrodes, etc., the method of ejecting a liquid drop is used, as in the first step.

First, a bank 61 is formed by the photolithography method so as to cover the gate wires 40 and the source wires 42, etc.

As shown in FIGS. 12A, 12B, and 12C, a substantially lattice-shaped bank 61 is formed.

Opening portions 62 are formed in the source wire 42 and the gate wire 40.

At the intersection 56 between the source wire 42 and the capacitance line 46, an opening portion 62 is formed.

As shown in FIG. 12B, in the opening portion 62, the laminate portion 35 (TFT 30) is formed above the gate electrode 41 so as to be partially exposed.

In other words, the bank 61 is formed so as to divide the laminate portion 35 (TFT 30) into two in the X direction.

As the material of the bank 61, for example, a polymeric material such as an acrylic resin, a polyimide resin, an olefin resin, a melamine resin is used, as same as the bank 51.

As same as the bank 51, the bank 61 is subjected to a liquid-repellency imparting treatment.

The opening portions 62 formed by the bank 61 correspond to formation positions of the conductive layers 49 that connect the divided source wires 42 or the source electrodes 43.

The regions surrounded by the bank 61 correspond to formation positions of the pixel electrodes 45 and the drain electrodes 44.

In other words, as described later, by disposing a transparent conductive material inside the opening portions 62 of the bank 61 and on the regions surrounded by the bank 61, the conductive layers 49 that connect the divided source wires 42, the source electrodes 43, drain electrodes 44, and the pixel electrodes 45 are formed.

A conductive material other than a transparent conductive material may be disposed inside the opening portions 62.

Since the pixel electrodes 45 are not formed inside the opening portions 62, a conductive material other than a transparent conductive material may be disposed.

Next, the protection film 60 formed on the entire surface of the substrate P is removed by the etching treatment with the bank 61 as a mask.

As a result, as shown in FIGS. 13B and 13C, the protection layer 60 formed on the regions where the bank 61 is not disposed is removed.

The metal protection films 47 formed on the lattice-patterned wiring are also removed.

Next, a transparent conductive material is ejected inside the opening portions 62 of the bank 61 and on the regions surrounded by the bank 61 by using the above-described liquid drop ejection apparatus IJ. Thus, the transparent conductive material is disposed.

The transparent conductive material is a dispersion liquid in which fine conductive particles of ITO are dispersed in a dispersion medium.

After the transparent conductive material is ejected on the substrate P, the dry treatment and the baling treatment are performed as required for removing the dispersion medium.

With the dry and baking treatments, electrical contact among fine conductive particles is secured to transform the particles into a conductive film.

Thus, as shown in FIGS. 14A, 14B, and 14C, the conductive layers 49 that connect the divided source wires 42, the source electrodes 43, drain electrodes 44, and the pixel electrodes 45 are formed on the substrate P. Thus, the active matrix substrate 20 is manufactured.

In this embodiment, as a material to be ejected and disposed inside the opening portions 62 of the bank 61 and on the regions surrounded by the bank 61, a transparent conductive material is adopted.

However, when the connection resistance is valued, a conductive material such as silver or copper may be used for the conductive layers 49 that connect the divided source wires 42 and the source electrodes 43.

In this embodiment, a method in which a transparent conductive material is disposed by the method of ejecting a liquid drop has been described. However, a transparent conductive material may be disposed by performing the sputtering treatment and the etching treatment. In this case, the bank 61 is not required.

As described above, in this embodiment, the gate electrode 41 is formed by the above-mentioned method of forming a metal wiring. Therefore, the gate electrode 41 has an excellent degree of contact and levelness.

As a result, also in the TFT 30 formed above the gate electrode 41 and onto which the levelness of the gate electrode 41 is transferred, quality and levelness can be improved.

Especially in a TFT 30 having a bottom-gate structure, electrons flow (move) through an interface between the active layer 32 of an amorphous silicon film functioning as a channel portion and the insulating film 31.

Thus, when the levelness of the active layer 32 is poor (out of level), the moving distance of electrons is longer, thus inhibiting the flow (movement) of electrons.

Therefore, by improving the levelness of the gate electrode 41 as the foundation of the active layer 32, the active layer 32 is leveled and the flow of electrons becomes smooth. As a result characteristics (field effect mobility) of the TFT 30 can be improved.

Electro-Optical Device

Next, a liquid crystal display device 100 will be described as an example of electro-optical devices using the active matrix substrate 20.

Figure 15:
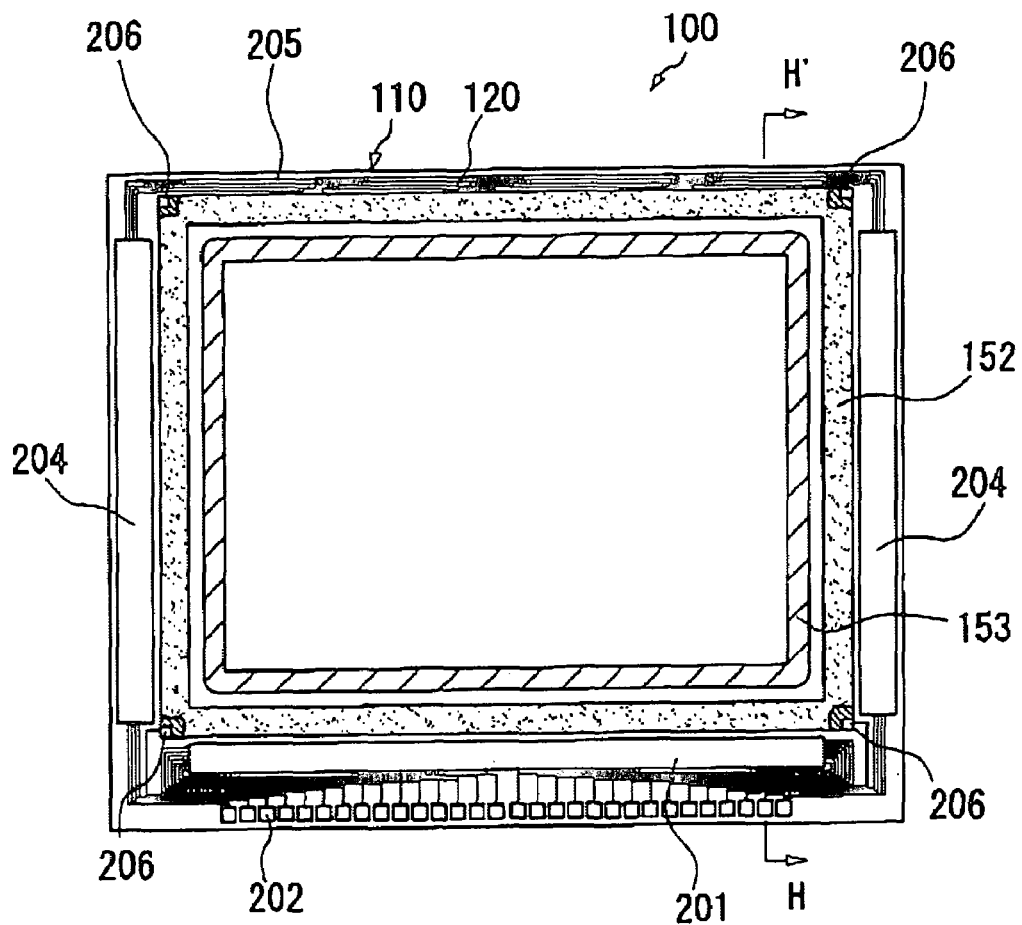
FIG. 15 is a plan view of a liquid crystal display device seen from the opposite substrate.

FIG. 15 is a plan view of the liquid crystal display device 100 seen from the opposite substrate. FIG. 16 is a cross-sectional view taken along the line H-H' in FIG. 15.

In the drawings used for the description below, scale sizes for every layer and member are made different to make the layers and the members large enough to be recognizable in the drawings.

In FIGS. 15 and 16, the liquid crystal display device 100 (electro-optical device) includes a TFT array substrate 110, am opposite substrate 120, a sealant 152, and a liquid crystal 150.

The TFT array substrate 110 includes the active matrix substrate 20 of the above-mentioned embodiment.

The opposite substrate 120 is disposed in opposition to the TFT array substrate 110.

The sealant 152 is a photo-curing sealing material. The sealant 152 bonds the TFT array substrate 110 and the opposite substrate 120 together.

The liquid crystal 150 is sealed in a region partitioned by the sealant 152. The liquid crystal 150 is held by the TFT array substrate 110, the opposite substrate 120, and the sealant 152.

The sealant 152 is formed in a framed shape closed in a region within the substrate surface.

The sealant 152 does not include a liquid crystal inlet and has no trace of being sealed by any sealing member.

In an inside region of the formation region of the sealant 152, a peripheral edge portion 153 made of a light-shielding material.

In an outside region of the sealant 152, a data line drive circuit 201 and packaging electrodes 202 are formed along one side of the TFT array substrate 110.

Along each of the two sides at are adjacent to this one side, a scan line drive circuit 204 is formed.

Along the other side of the TFT array substrate 110, a plurality of wires 205 are provided for connecting the scan line drive circuits 204 provided on both sides of the image display region.

In at least one corner portion of the opposite substrate 120, an inter-substrate conduction material 206 is arranged for obtaining electrical conduction between the TFT array substrate 110 and the opposite substrate 120.

Instead of forming the data line drive circuit 201 and the scan line drive circuits 204 on the TFT array substrate 110, for example, a Tape Automated Bonding (TAB) substrate packaged with a driving LSI may be electrically and mechanically connected with a group of electrodes formed in the peripheral region of the TFT array substrate 110 via an anisotropic conductive film.

In the liquid crystal display device 100, a retardation plate, a polarizing plate, or the like may be disposed in a predetermined orientation (not shown) according to a type of the liquid crystal 150 to be used, i.e., according to the kind of operation mode such as a TN (Twisted Nematic) mode, a C-EN method, a VA system, and an IPS system, or to a normally white mode/normally black mode.

When the liquid crystal display device 100 is configured for color display use, for example, color filters of red (R), green (G), blue (B) are formed together with the protection films thereof in a region, of the opposite substrate 120, facing each pixel electrode (described later) of the TFT array substrate 110.

An electro-optical device using the active matrix substrate 20 is applicable to, for example, an organic electroluminescence (EL) display device.

In an organic EL display device, a thin film including inorganic and organic fluorescent compounds is sandwiched between the cathode and the anode.

In the organic EL display device, exciters (exitons) are generated by injecting electrons and positive holes (holes) into the thin film for excitation. Radiation of light (fluorescent light, phosphorescent light) in the recombination of exitons is utilized for light emission.

Out of the fluorescent materials used for display elements of an organic EL, materials that present light emitting colors of red, green, and blue, that is, materials for forming a light emitting layer and materials for forming a hole injection/hole transfer layer are used as inks to pattern the materials for each color, and thus a self-luminescent full-color organic EL display device can be manufactured.

Furthermore, the active matrix substrate 20 is also applicable to a plasma display panel (PDP), a surface-conduction electron-emitter, etc.

A surface-conduction electron-emitter utilizes a phenomenon in which electron emission is generated by passing an electric current in parallel with the surface of a small area thin film formed on the substrate.

Electronic Device

Next, specific examples of an electronic device of this invention will be described.

Figure 17A:
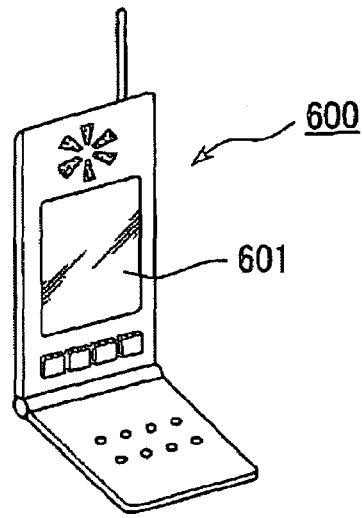
FIGS. 17A to 17C are drawings showing specific examples of electronic devices.

FIG. 17A is a perspective view showing an example of a cellular phone.

In FIG. 17A, reference numeral 600 denotes a main unit of the cellular phone, and reference numeral 601 denotes a display portion provided with the liquid crystal display device 100 of the above-mentioned embodiment.

Figure 17B:
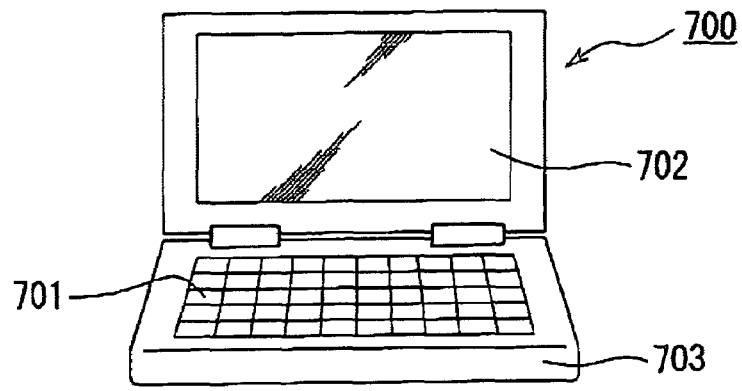

FIG. 17B is a perspective view of an example of a portable information processing device such as a word processor and a personal computer.

In FIG. 17B, reference numeral 700 denotes an information processing device, reference numeral 701 denotes an input portion such as a keyboard, reference numeral 703 denotes a main unit of the information processing device, and reference numeral 702 denotes a display portion provided with the liquid crystal display device 100 of the above-mentioned embodiment.

Figure 17C:
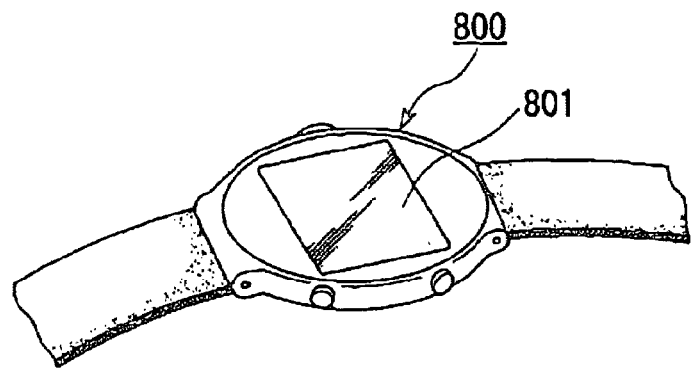
Figure 18:
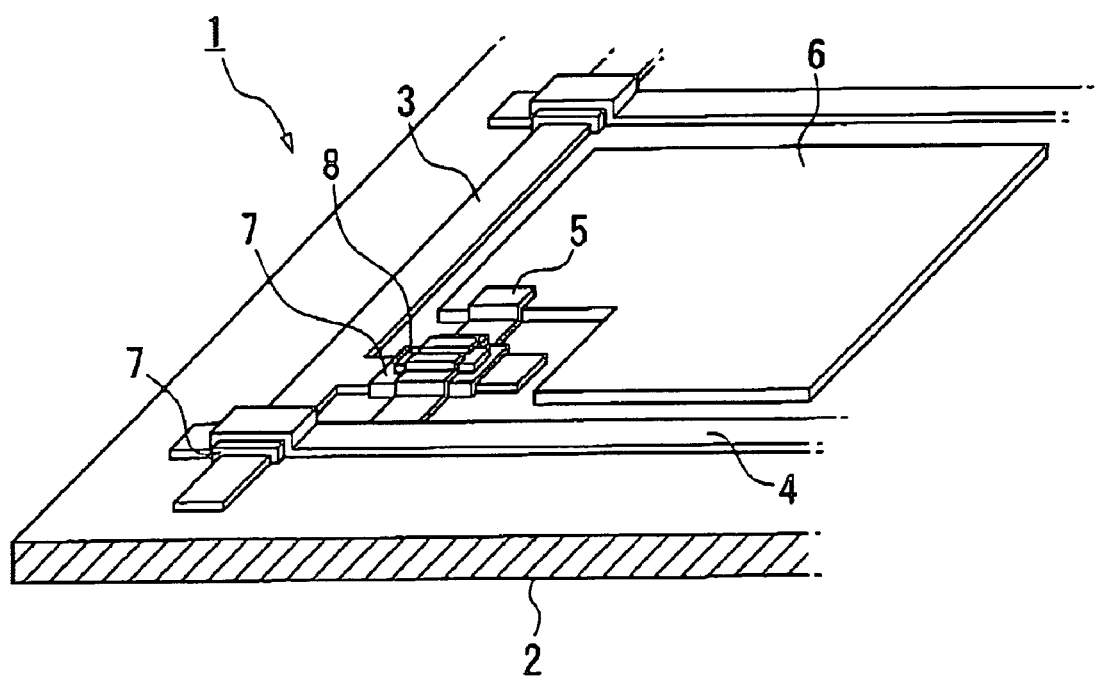
FIG. 18 is a perspective view of a conventional active matrix substrate.

FIG. 17C is a perspective view of an example of a wrist-watch-type electronic device.

In FIG. 17C, reference numeral 800 denotes a main unit of the wrist-watch, and reference numeral 801 denotes a display portion of the liquid crystal display device 100 of the above-mentioned embodiments.

Thus, electronic devices shown in FIGS. 17A to 17C are provided with the liquid crystal display device 100 of the above-mentioned embodiment. Therefore, characteristic of the TFT are improved and thus high quality and performance is obtained.

Furthermore, this embodiment can be used in a large liquid crystal panel for a television set, a monitor, etc.

The electronic device of this embodiment has been described as provided with the liquid crystal display device 100. However, the electronic device may be provided with another electro-optical device such as an organic electroluminescence display device and a plasma-type display device.

Preferred embodiments according to this invention have been described with reference to the appended drawings. However, this invention is not limited to such examples.

Shapes, combinations or the like of the constituent members illustrated above are merely examples, and various modifications based on design requirements or the like can be made without departing from the spirit or scope of the invention.

For example, in the above embodiments, fine particles of silver are used for fine metal particles. Other than this, however, fine particles of the abovementioned Au, Ni, Al, ITO, Pd, Bi, or a mixture of these may be used.

Similarly, the dispersion stabilizer is not limited to an amino compound. Another organic substance may be used.

In the above embodiments, the gate wires 40, gate electrodes 41, source wires 42, and capacitance lines 46 of the active matrix substrate have been described as formed by the method of forming a metal wiring according to this invention. Other than these, however, the forming method is applicable when forming the source electrodes, the drain electrodes, and the pixel electrodes.

What is claimed is:

1. A method of forming a metal wiring, comprising:
   forming a foundation layer on a substrate;
   applying a solution including fine metal particles and a dispersion stabilizer on the foundation layer; and
   heating the applied solution to form into a conductive layer, wherein
   after the applying of the solution, the conductive layer is formed by starting the heating of the applied solution, and wherein
   the forming of the foundation layer includes:
      applying a liquid substance including a foundation forming material on the substrate; and
      heating at a temperature at which the liquid substance is in a partially crystallized state.

2. The method of forming a metal wiring according to claim 1, wherein
   after the applying of the solution, the conductive layer is formed by starting the heating of the applied solution within ten minutes.

3. The method of forming a metal wiring according to claim 1, wherein
   after the applying of the solution, the conductive layer is formed by starting the heating of the applied solution within five minutes.

4. The method of forming a metal wiring according to claim 1, wherein
   the fine metal particles are made of one or a mixture selected from the group consisting of Au, Ag, Ni, Al, ITO, Pd, Bi, Cu, and Mn.

5. The method of forming a metal wiring according to claim 1, wherein
   the heat-treatment is performed under a nitrogen atmosphere.

6. A method of manufacturing an active matrix substrate, comprising:
   a first step of forming a gate wire on a substrate;
   a second step of forming a gate insulating film on the gate wire;
   a third step of laminating a semiconductor layer via the gate insulating film; and
   a fourth step of forming a source electrode, a drain electrode, and a pixel electrode on the gate insulating layer, wherein
   the first step further includes:
      forming a foundation layer on the substrate;
      applying a solution including fine metal particles and a dispersion stabilizer on the foundation layer; and
      heating the applied solution to form into the gate wire, wherein
      after the applying of the solution, the gate wire is formed by starting the heating of the applied solution, and wherein
      the forming of the foundation layer includes:
         applying a liquid substance including a foundation forming material on the substrate; and
         heating at a temperature at which the liquid substance is in a partially crystallized state.

7. The method of manufacturing an active matrix substrate according to claim 6, wherein
   the fine metal particles are made of one or a mixture selected from the group consisting of Au, Ag, Ni, Al, ITO, Pd, Bi, Cu, and Mn.

8. The method of manufacturing an active matrix substrate according to claim 6,
   the heat-treatment is performed under a nitrogen atmosphere.

* * * * *